(12) United States Patent
Yamaguchi

(10) Patent No.: US 10,237,981 B2
(45) Date of Patent: Mar. 19, 2019

(54) METHOD OF MANUFACTURING MOUNTING SUBSTRATE AND MOUNTING SUBSTRATE MANUFACTURING APPARATUS

(71) Applicant: Sharp Kabushiki Kaisha, Sakai, Osaka (JP)

(72) Inventor: Katsuhiro Yamaguchi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/538,624

(22) PCT Filed: Dec. 18, 2015

(86) PCT No.: PCT/JP2015/085470
§ 371 (c)(1),
(2) Date: Jun. 21, 2017

(87) PCT Pub. No.: WO2016/104351
PCT Pub. Date: Jun. 30, 2016

(65) Prior Publication Data
US 2017/0354041 A1  Dec. 7, 2017

(30) Foreign Application Priority Data

Dec. 25, 2014  (JP) ................................. 2014-262138

(51) Int. Cl.
*H05K 3/30* (2006.01)
*H05K 3/32* (2006.01)
(Continued)

(52) U.S. Cl.
CPC ............... *H05K 3/323* (2013.01); *G02F 1/13* (2013.01); *G02F 1/1303* (2013.01);
(Continued)

(58) Field of Classification Search
CPC . H05K 1/14; H05K 3/323; H05K 3/36; H01L 24/31; H01L 24/75; H01L 24/83; G02F 1/13; G09F 9/30
See application file for complete search history.

(56) References Cited

U.S. PATENT DOCUMENTS

2011/0188214 A1 * 8/2011 Mishiro ................. H05K 3/361
361/749

FOREIGN PATENT DOCUMENTS

JP          10070396 A  *  3/1998
JP        2000068633 A  *  3/2000 ............ H01L 24/75
(Continued)

*Primary Examiner* — Paul D Kim
(74) *Attorney, Agent, or Firm* — ScienBiziP, P.C.

(57) ABSTRACT

A method of manufacturing a mounting substrate includes a provisional pressing process, a driver pressing process, and a flexible printed circuit board pressing process. In the provisional pressing process, a driver and a flexible printed circuit board are provisionally pressed. In the driver pressing process, the driver is thermally pressed with a pressing head having a driver pressing surface and a flexible printed circuit board pressing surface, and pressure force is applied to the driver with elastically deforming a buffer. In the flexible printed circuit board pressing process, the pressing head is moved closer to the glass substrate such that a height level of the flexible printed circuit board pressing surface with respect to a mounting surface and a height level of the driver pressing surface with respect to the mounting surface are same and pressure force is applied to the flexible printed circuit board with elastically deforming the buffer.

7 Claims, 13 Drawing Sheets

(51) Int. Cl.
  *G02F 1/13*     (2006.01)
  *G09F 9/30*     (2006.01)
  *H01L 23/00*    (2006.01)
  *H05K 1/14*     (2006.01)
  *H05K 3/36*     (2006.01)
  *G02F 1/1345*   (2006.01)

(52) U.S. Cl.
  CPC ............ *G02F 1/13454* (2013.01); *G09F 9/30* (2013.01); *H01L 24/31* (2013.01); *H01L 24/75* (2013.01); *H01L 24/83* (2013.01); *H05K 1/14* (2013.01); *H05K 1/147* (2013.01); *H05K 3/36* (2013.01); *H01L 2224/73204* (2013.01); *H05K 2203/0278* (2013.01)

(56) References Cited

FOREIGN PATENT DOCUMENTS

| | | | |
|---|---|---|---|
| JP | 2000-275593 | A | 10/2000 |
| JP | 2005-086145 | A | 3/2005 |
| JP | 2008263161 | A * | 10/2008 |
| JP | 2009-157200 | A | 7/2009 |
| JP | 2010-283131 | A | 12/2010 |
| WO | 2010095311 | A | 8/2010 |

\* cited by examiner

METHOD OF MANUFACTURING MOUNTING SUBSTRATE AND MOUNTING SUBSTRATE MANUFACTURING APPARATUS

TECHNICAL FIELD

The present invention relates to a method of manufacturing a mounting substrate and a mounting substrate manufacturing apparatus.

BACKGROUND ART

A Display device including a display panel such as a liquid crystal panel is used for portable electronic devices such as mobile phones, smartphones, and notebook computers. Such a display device includes a display panel including a display panel having a display portion displaying images, and semiconductor ships that drive the display panel by processing input signals from a signal supply source and generating output signals and supplying the output signals to the display portion. In such a display device that is classified as a small-to-medium size, the semiconductor chips may be preferably mounted by the chip-on-glass (COG) mounting method in that the semiconductor chips are directly mounted in an area of the display panel other than a display portion. An example of an apparatus of manufacturing such a display device is described in Patent Document 1.

RELATED ART DOCUMENT

Patent Document

Patent Document 1: Japanese Unexamined Patent Application Publication No. 2005-86145

PROBLEM TO BE SOLVED BY THE INVENTION

Patent Document 1 describes a method of thermally pressing the IC chip (an electronic component) and the FPC (a flexible printed circuit board) simultaneously. A thermally pressing device that thermally presses the IC chip and the FPC is used in such a method. In the thermally pressing device, each of an IC chip thermally pressing head and a FPC thermally pressing head is movable independently in a vertical direction.

However, a frame width of the liquid crystal panel has been reduced and following problems may be caused. If the frame width of the liquid crystal panel is reduced, the IC chip and the FPC are very close to each other and positioning of the IC chip thermally pressing head and the IC chip and positioning of the FPC thermally pressing head and the FPC are very difficult. If the positioning of the components is not correct, the FPC thermally pressing head may be in contact with the IC chip and a mounting error of the IC chip or the FPC may be caused.

DISCLOSURE OF THE PRESENT INVENTION

The present invention was made in view of the above circumstances. An object is to achieve less occurrence of mounting errors of an electronic component and a flexible printed circuit board.

Means for Solving the Problem

A method of manufacturing a mounting substrate according to the present invention includes a provisional pressing process in which an electronic component and a flexible printed circuit board are provisionally pressed on a substrate, the flexible printed circuit board for transferring signals from outside and the electronic component for processing the signals from the flexible printed circuit board being mounted on one plate surface of the substrate, an electronic component pressing process in which a provisionally pressed electronic component is thermally pressed with using a pressing head having an electronic component pressing surface for pressing the electronic component and a flexible printed circuit board pressing surface for pressing the flexible printed circuit board, and the pressing head is moved closer to the substrate with having a buffer between the electronic component pressing surface and the electronic component and presses the electronic component with elastically deforming the buffer, and a flexible printed circuit board pressing process in which a provisionally pressed flexible printed circuit board is thermally pressed to the substrate with using the pressing head, and the pressing head is moved closer to the substrate having the buffer between the flexible printed circuit board pressing surface and the flexible printed circuit board such that a height level of the flexible printed circuit board pressing surface with respect to the one plate surface of the substrate is same as a height level of the electronic component pressing surface with respect to the one plate surface of the substrate in the electronic component pressing process, and the pressing head presses the flexible printed circuit board with elastically deforming the buffer.

According to the present invention, the pressing is executed with one pressing head such that the electronic component pressing surface and the flexible printed circuit board pressing surface are at a same height from the substrate in the electronic component pressing process and the flexible printed circuit board pressing process. Accordingly, a predetermined pressure force can be applied to the electronic component and the flexible printed circuit board, even if the electronic component and the flexible printed circuit board may be arranged very close to each other due to reduction in frame size of the display device and the flexible printed circuit board pressing surface may be in contact with the electronic component. Therefore, the electronic component and the flexible printed circuit board can be surely mounted on the substrate.

Preferable embodiments of the method of manufacturing a mounting substrate may include the following processes.

(1) The electronic component pressing process and the flexible printed circuit board pressing process may be performed simultaneously, the pressing head may have a flat opposing surface opposing the one plate surface of the substrate, and the opposing surface may include the electronic component pressing surface and the flexible printed circuit board pressing surface to be arranged. According to such a method, a portion where mounting is executed and the mounting portion of the substrate where the mounting is executed in one of the electronic component mounting process and the flexible printed circuit board mounting process are not heated again in another one of the processes after being cooled down, even if the electronic component and the flexible printed circuit board are arranged to be close to each other due to the reduction of frame size of the display device. Therefore, a bonding strength of the mounted portion is less likely to be lowered or unintentional reaction force is less likely to be generated due to deformation of the panel by re-heating of the mounted portion and the mounting portion of the substrate.

(2) The method may further include a positioning process in which the provisionally pressed electronic component and the provisionally pressed flexible printed circuit board may be positioned with respect to the pressing head, the electronic component may be on an inner side with respect to the flexible printed circuit board on the one plate surface of the substrate, and a position of an inner side edge portion of the electronic component may be detected and the position of the inner side edge portion of the electronic component may be positioned with respect to the pressing head. In the present invention, no step or no gap is provided at a border between the electronic component pressing surface and the flexible printed circuit board pressing surface. Therefore, it is not necessary to position the border between the electronic component pressing surface and the flexible printed circuit board pressing surface of the pressing head with respect to the position between the electronic component and the flexible printed circuit board. Therefore, in the positioning process, positioning of the pressing head, the electronic component, and the flexible printed circuit board are performed effectively only by positioning the inner side edge portion of the electronic component that is on an opposite edge portion from the flexible printed circuit board with respect to the pressing head. Thus, the number of positioning parts in the positioning process is reduced and manufacturing efficiency is improved.

(3) The electronic component pressing process and the flexible printed circuit board pressing process may be successively performed in this sequence or in a reverse sequence. One of the electronic component pressing process and the flexible printed circuit board pressing process that is performed first may be a previous process and another one of the electronic component pressing process and the flexible printed circuit board pressing process that is performed later may be a latter process, and a performance of the latter process may be started with keeping a heated state of the substrate that is heated in the previous process. According to such a method, a portion where mounting is executed and the mounting portion of the substrate where the mounting is executed in one of the electronic component mounting process and the flexible printed circuit board mounting process are not heated again in another one of the processes after being cooled down, even if the electronic component and the flexible printed circuit board are arranged to be close to each other due to the reduction of frame size of the display device. Therefore, a bonding strength of the mounted portion is less likely to be lowered or unintentional reaction force is less likely to be generated due to deformation of the panel by re-heating of the mounted portion and the mounting portion of the substrate.

(4) The method may further include a terminal cleaning process in which an electronic component mounting portion and a flexible printed circuit board mounting portion of the substrate are collectively cleaned, the electronic component mounting portion including electronic component terminals where the electronic component is to be mounted and the flexible printed circuit board mounting portion including flexible printed circuit board terminals where the flexible printed circuit board is to be mounted, and an anisotropic conductive film applying process in which an anisotropic conductive film is applied on each of a cleaned electronic component mounting portion and a cleaned flexible printed circuit board before the provisional pressing process. According to such a method, after the terminal cleaning process, the anisotropic conductive films are applied to the electronic component mounting portion and the flexible printed circuit board mounting portion, respectively, without being subjected to the electronic component pressing process or the flexible printed circuit board pressing process. Accordingly, foreign obstacles are less likely to be adhered on the electronic component mounting portion and the flexible printed circuit board mounting portion after the terminal cleaning process and before applying the anisotropic conductive films.

A mounting substrate manufacturing apparatus according to the present invention includes a substrate support portion supporting a substrate that has one plate surface and another plate surface, a flexible printed circuit board for transmitting signals from outside and an electronic component for processing the signals from the flexible printed circuit board are to be mounted on the one plate surface of the substrate, the substrate support portion supporting the substrate from another plate surface side, a pressing head arranged on a side of the one plate surface of the substrate, the pressing head having an electronic component pressing surface pressing the electronic component with respect to the substrate support portion and a flexible printed circuit board pressing surface pressing the flexible printed circuit board with respect to the substrate support portion, and the pressing head having a flat opposing surface opposing the one plate surface of the substrate and the opposing surface including the electronic component pressing surface and the flexible printed circuit board pressing surface, and moving means moving the pressing head to be closer to the substrate, the moving means moving the pressing head such that the electronic component pressing surface and the flexible printed circuit board pressing surface are at a same height level with respect to the one plate surface of the substrate, and the moving means applying pressure force to the electronic component and the flexible printed circuit board with elastically deforming a buffer that is between the electronic component pressing surface and the electronic component and between the flexible printed circuit board pressing surface and the flexible printed circuit board.

According to the present invention, the electronic component and the flexible printed circuit board are thermally pressed with one pressing head such that the electronic component pressing surface and the flexible printed circuit board pressing surface are at a same height with respect to the substrate. Even if the electronic component and the flexible printed circuit board may be arranged very close to each other due to reduction in frame size of the display device and the flexible printed circuit board pressing surface may be in contact with the electronic component, a predetermined pressing force can be applied to the flexible printed circuit board and the electronic component. Therefore, the flexible printed circuit board and the electronic component can be surely mounted on the substrate.

Preferable embodiments of the mounting substrate manufacturing apparatus may include the following configurations.

(1) The substrate support portion may support the substrate having a substrate support portion-side buffer between the substrate and the substrate support portion. According to such a configuration, the load applied to the electronic component mounting portion and the flexible printed circuit board mounting portion are reduced via the buffer and the substrate support portion-side buffer even if the electronic component and the flexible printed circuit board have different height dimensions.

Advantageous Effect of the Invention

According to the present invention, mounting errors of an electronic component and a flexible printed circuit board are less likely to be caused.

MODE FOR CARRYING OUT THE INVENTION

<First Embodiment>

Figure 1:
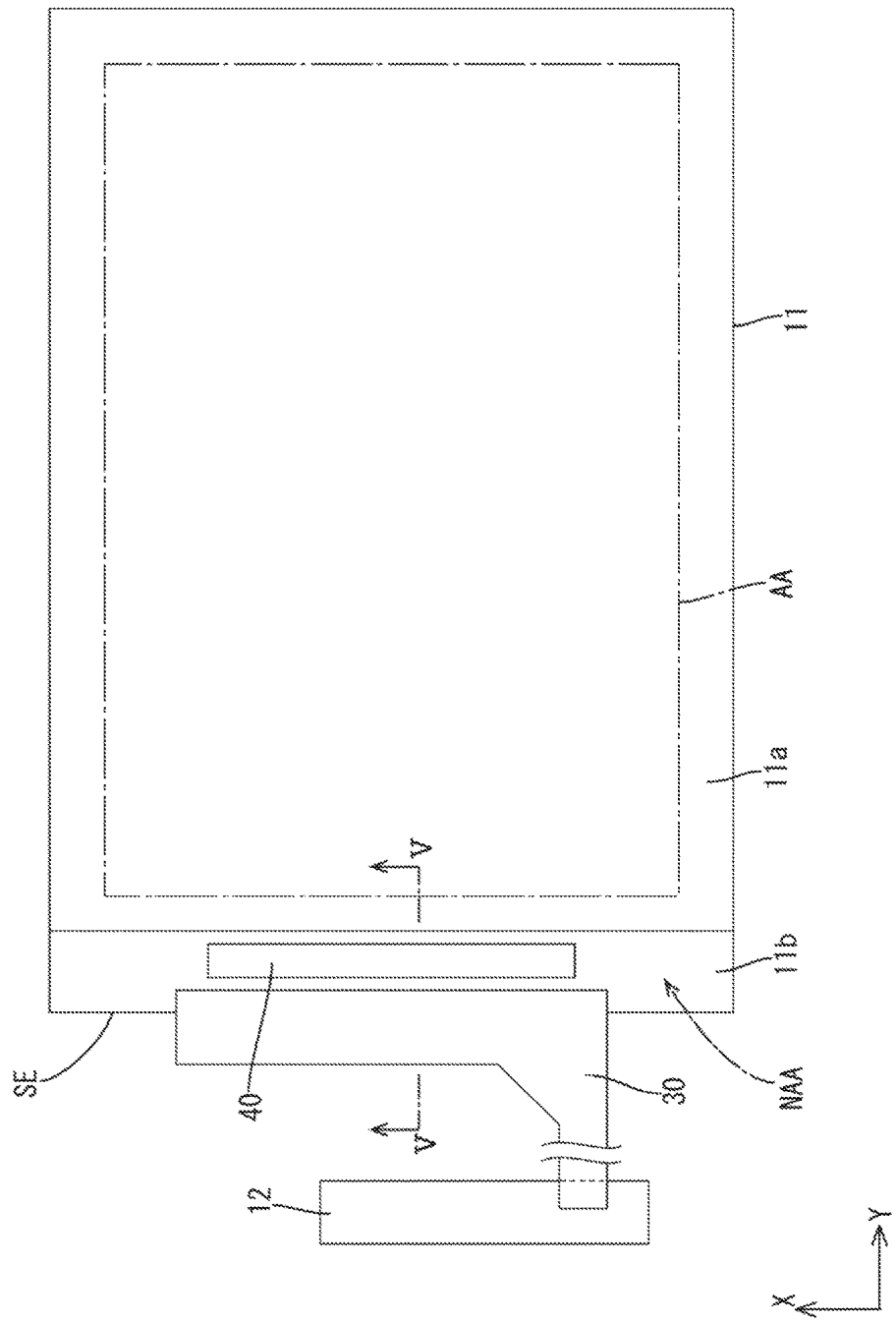
FIG. 1 is a schematic plan view illustrating a connection configuration of a liquid crystal panel where a driver is mounted, a flexible printed circuit board, and a control circuit board according to a first embodiment of the present invention.

A first embodiment will be described with reference to FIGS. 1 to 8. In the present embodiment, a method of manufacturing a liquid crystal panel 11 included in a liquid crystal display device 10 and a driver and flexible printed circuit board mounting apparatus (a manufacturing apparatus) 50 used in the manufacturing method will be described. X-axis, Y-axis and Z-axis may be indicated in the drawings. The axes in each drawing correspond to the respective axes in other drawings. The vertical direction is defined based on FIGS. 2 and 3. An upper side and a lower side in the drawings correspond to a front side and a back side, respectively.

Figure 2:
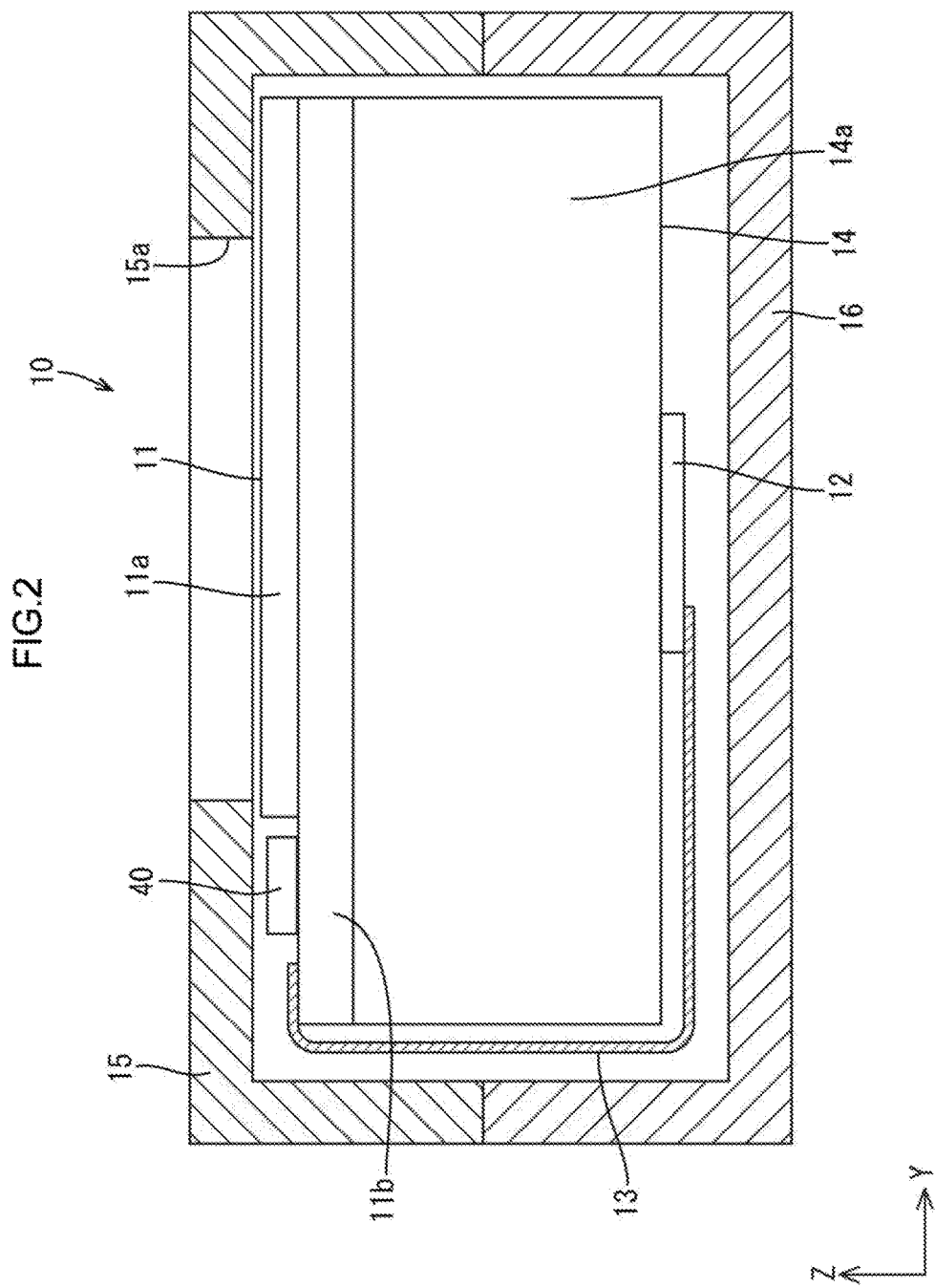
FIG. 2 is a schematic cross-sectional view of a liquid crystal display device illustrating a cross-sectional configuration along a long-side direction thereof.

As illustrated in FIGS. 1 and 2, a liquid crystal display device 10 includes the liquid crystal panel 11, a control circuit board (an external signal source) 12, a flexible printed circuit board (an external connector) 13, and a backlight unit (a lighting device) 14. A driver (a mounting component) 40 is mounted on the liquid crystal panel 11. The control circuit board 12 supplies various input signals from outside to the driver 21. The flexible printed circuit board 13 electrically connects the liquid crystal panel 11 and the external control circuit board 12. The backlight unit 14 is an external light source that supplies light to the liquid crystal panel 11. The liquid crystal display device 10 further includes a pair of exterior components 15 and 16 that are front and rear components used in a pair to hold the liquid crystal panel 11 and the backlight unit 14 that are attached together. The exterior component 15 on the front has an opening 15a through which images displayed on the liquid crystal panel 11 are viewed from the outside. The liquid crystal display device 10 according to this embodiment may be used in various kinds of electronic devices (not illustrated) such as handheld terminals (including electronic books and PDAs), mobile phones (including smartphones), notebook computers (including tablet computers), digital photo frames, portable video game players, and electronic-ink papers. The liquid crystal panel 11 in the liquid crystal display device 10 is in a range between some inches to ten and some inches. Namely, the liquid crystal panel 11 is in a size that is classified as a small or a small-to-medium.

The backlight unit 14 will be described. As illustrated in FIG. 2, the backlight unit 14 includes a chassis 14a, light sources (e.g., cold cathode fluorescent tubes, LEDs, organic ELs), an optical member. The chassis 14a has a box-like shape with an opening on the front (on a liquid crystal panel 11 side). The light sources, which are not illustrated, are disposed inside the chassis 14a. The optical member, which is not illustrated, is arranged so as to cover the opening of the chassis 14a. The optical member has a function to convert light from the light sources into planar light.

Next, the liquid crystal panel 11 will be described. As illustrated in FIG. 1, the liquid crystal panel 11 has a horizontally-long rectangular overall shape. The liquid crystal panel 11 includes a display area (an active area) AA that is off centered toward one of ends of a short dimension thereof (the right side in FIG. 1). The driver 40 and the flexible printed circuit board 30 are arranged at the other end SE of the short dimension of the liquid crystal panel 11 (the left side in FIG. 1). An area of the liquid crystal panel 11 outside the display area AA is a non-display area (non-active area) NAA in which images are not displayed and the non-display area includes a mounting area in which the driver 40 and the flexible printed circuit board 30 are mounted. A short-side direction and a long-side direction of the liquid crystal panel 11 correspond to the X-axis direction and the Y-axis direction in each drawing. In FIG. 1, a chain line box slightly smaller than the CF board 11a indicates a boundary of the display area AA. An area outside the chain line is the non-display area NAA.

Figure 3:
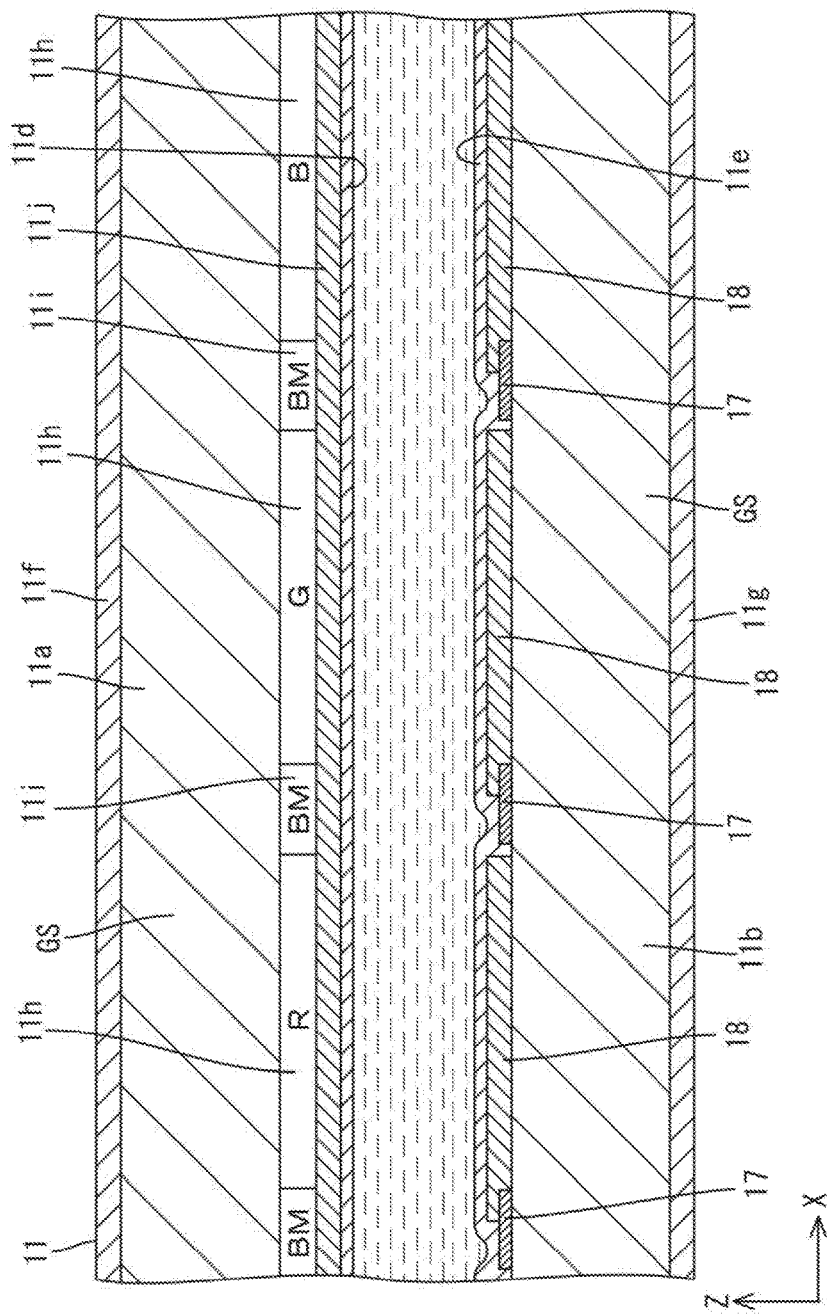
FIG. 3 is a schematic cross-sectional view illustrating a cross-sectional configuration of the liquid crystal panel.

As illustrated in FIG. 3, the liquid crystal panel 11 includes a pair of transparent substrates (having high transmissivity) 11a, 11b, and a liquid crystal layer 11c between the substrates 11a and 11b. The liquid crystal layer 11c includes liquid crystal molecules having optical characteristics that vary according to application of electric field. The substrates 11a and 11b are bonded together with a sealing agent, which is not illustrated, with a cell gap therebetween. The cell gap corresponds to a thickness of the liquid crystal layer 11c. The substrates 11a, 11b include glass substrates (substrate) GS made of alkali-free glass or quartz glass, and includes films that are layered on the glass substrates GS with the known photolithography method. One of the substrates 11a, 11b on the front (on a front surface side) is a CF substrate (an opposing substrate) and the other one on a back side (on a rear surface side) is an array substrate (a mounting substrate, a component substrate, an active matrix substrate) 11b. As illustrated in FIGS. 1 and 2, the CF substrate 11a has a short-side dimension substantially same as that of the array substrate 11b and has a long-side dimension smaller than that of the array substrate 11b. The CF substrate 11a and the array substrate 11b are bonded together such that long-side edges (upper-side edges in FIG. 1) thereof are aligned with each other. According to such a configuration, the CF substrate 11a and the array substrate 11b are not overlapped with each other in the other long-side edge portions thereof (lower-side edges in FIG. 1) over a certain area and the long-side edge portion of the array substrate 11b is exposed outside on the front and rear plate surfaces thereof. Thus, the exposed portion is a mounting area where the driver 40 and the flexible printed circuit board 30 are mounted. Alignment films 11d and 11e are formed on inner surfaces of the substrates 11a and 11b, respectively, for aligning the liquid crystal molecules included in the liquid crystal layer 11c. Polarizing plates 11f and 11g are bonded to outer surfaces of the substrates 11a and 11b, respectively.

Next, components on the array substrate 11b and the CF substrate 11a in the display area AA will be described in detail. As illustrated in FIG. 3, a number of the TFTs (thin film transistors) 17 and a number of pixel electrodes 18 are arranged in a matrix on the inner surface of the array substrate 11b (a mounting surface 21 side, the liquid crystal layer 11c side, the opposed surface side opposed to the CF substrate 11a). Furthermore, the gate lines and the source lines 20 (both not illustrated) are arranged in a grid to surround the TFTs 17 and the pixel electrodes 18. Namely, the TFTs 17 and the pixel electrodes 18 are arranged at the respective intersections of the gate lines and the source lines and in a grid. The gate lines and the source lines are connected to gate electrodes and source electrodes of the TFTs 17, respectively. The pixel electrodes 18 are connected to drain electrodes 17c of the TFTs 17. Each of the pixel electrodes 18 has a vertically long rectangular shape in a plan view. The pixel electrodes 18 are made of transparent electrode material such as indium tin oxide (ITO) and zinc oxide (ZnO). Furthermore, an auxiliary capacitor line (not illustrated) may be formed to be parallel to the gate lines and to cross the pixel electrodes 18.

As illustrated in FIG. 3, color filters 11h are formed on the CF substrate 11a. The color filters 11h include red (R), green (G), and blue (B) color portions are arranged in a matrix to overlap the pixel electrodes 18 on the array substrate 11b in a plan view. A light blocking layer 11i having a grid shape (a black matrix) is formed between the color portions included in the color filters 11h for reducing color mixture. The light blocking layer 11i is arranged to overlap the gate lines and the source lines in a plan view. A counter electrode 11j is formed in a solid pattern on surfaces of the color filters 11h and the light blocking layer 11i. The counter electrode 11j is opposed to the pixel electrodes 18 on the array substrate 11b. In the liquid crystal panel 11, as illustrated in FIGS. 1 to 3, the R (red) color portion, the G (green) color portion, the B (blue) color portion, and three pixel electrodes 18 opposed to the color portions form a display pixel that is a display unit. Each display pixel includes a red pixel including the R color portion, a green pixel including the G color portion, and a blue pixel including the B color portion. The color pixels are repeatedly arranged along a row direction (the X-axis direction) on a plate surface of the liquid crystal panel to form lines of pixels. The lines of pixels are arranged along the column direction (the Y-axis direction).

The liquid crystal panel 11 has been required to be reduced in thickness and weight thereof and the glass substrates GS, GS of the CF substrate 11a and the array substrate 11b of the liquid crystal panel 11 are also required to be thinner. In the present embodiment, after a pattering process in which a various films are formed on each of the glass substrates GS, GS of the CF substrate 11a and the array substrate 11b, an outer side plate surface of each of the glass substrates GS, GS is processed with etching (wet etching). The outer side plate surface of the glass substrate GS is an opposite plate surface from the plate surface having the various films are formed. Accordingly, the glass substrates GS, GS are processed to be thinner. In the present embodiment, the glass substrates GS, GS are subjected to such thinning process so as to have a plate thickness of approximately 150 μm.

The components connected to the liquid crystal panel 11 will be described. As illustrated in FIGS. 1 and 2, the control circuit board 12 is attached to the back surface of the chassis 14a of the backlight unit 14 (an outer surface on a side opposite from the liquid crystal panel 11 side) with a screw or other fixing member. The control circuit board 12 includes a substrate made of paper phenol or glass epoxy resin and electronic components mounted on the substrate for supplying various kinds of input signals to the driver 40. The control circuit board 12 further includes predetermined traces (conductive lines), which are not illustrated, routed on the substrate. One of ends (a first end) of the flexible printed circuit board 13 is electrically and mechanically connected to the control circuit board 12 via an anisotropic conductive film, which is not illustrated.

As illustrated in FIG. 2, the flexible printed circuit board 30 includes a film base member made of synthetic resin (e.g., polyimide resin) having an insulating property and flexibility. The flexible printed circuit board 30 includes traces (not illustrated) on the base member. As described earlier, the first end, which is one of ends of the flexible printed circuit board 30 with respect to the length direction thereof, is connected to the control circuit board 12 on the back surface of the chassis 14a. Another edge portion (another edge portion side) 31 of the flexible printed circuit board 30 is connected to the array substrate 11b of the liquid crystal panel 11. Namely, the flexible printed circuit board 30 is folded such that a shape in a cross-sectional view is a U-like shape. The ends of the flexible printed circuit board 30 with respect to the length direction include exposed portions of traces which form terminals (not illustrated). The terminals are electrically connected to the control circuit board 12 and the liquid crystal panel 11. According to the configuration, the input signals supplied by the control circuit board 12 are transmitted to the liquid crystal panel 11. In later description, among the terminals, ones connected to the liquid crystal panel 11 are referred to as flexible printed circuit board side terminals 33. The flexible printed circuit board 30 is directly mounted on a mounting surface 21 that is one plate surface of the glass substrate GS of the array substrate 11b with the FOG (film on glass) mounting technology. The flexible printed circuit board 30 has a flexible printed circuit board side pressed surface 32 that is pressed by a pressing head 52, which will be described later (see FIG. 5). The flexible printed circuit board side pressed surface 32 is a film surface of the edge portion 31 of the flexible printed circuit board 30 that is an opposite surface from the surface where the flexible printed circuit board side terminals 33 are formed. The flexible printed circuit board 30 is at the position with a height dimension T1 from the mounting surface 21 of the glass substrate GS and the height dimension T1 is from 0.03 mm to 0.2 mm. The flexible printed circuit board side pressed surface 32 is a flat surface that is substantially parallel to the mounting surface 21.

As illustrated in FIG. 1, the driver 40 includes an LSI chip including a driver circuit therein. The driver 40 operates according to signals supplied by the control circuit board 12, which is a signal source, process the input signals supplied by the control circuit board 12, which is a signal source, generates output signals, and sends the output signals to the display area AA of the liquid crystal panel 11. The LSI chip included in the driver 40 includes traces and components formed on a silicon wafer that contains silicon with high purity. The driver 40 is directly mounted on the mounting surface 21 that is one plate surface of the glass substrate GS of the array substrate 11b in the non-display area NAA of the liquid crystal panel 11 with the COG (chip on glass) mounting technology. The driver 40 has a horizontally long rectangular shape in the plan view. The driver 40 is orientated such that a long-side direction thereof is along the short-side direction of the liquid crystal panel 11. The driver 40 has an upper surface that is a driver-side pressed surface 42 that is pressed by the pressing head 52 (see FIG. 5). The driver 40 is at the position with a height dimension T2 from the mounting surface 21 of the glass substrate GS and the height dimension T2 is from 0.1 mm to 0.3 mm, and the driver-side pressed surface 42 is a flat surface that is parallel to the mounting surface 21. In the present embodiment, the height of the driver-side pressed surface 42 of the driver 40 is higher than the height of the flexible printed circuit board side pressed surface 32 of the flexible printed circuit board 30 (T2≥T1). Specifically, the driver-side pressed surface 42 is in a position higher than the flexible printed circuit board side pressed surface 32 by approximately from 0 to 0.10 mm (T2−T1=0 to 0.10 mm). Recently, the electronic components such as the driver 40 have been reduced in thickness and a height difference or a gap between the driver 40 and the flexible printed circuit board side pressed surface 32 is smaller.

Next, a connection configuration of the flexible printed circuit board 30 and the driver 40 that are connected to the array substrate 11b in the non-display area NAA will be described.

Figure 4:
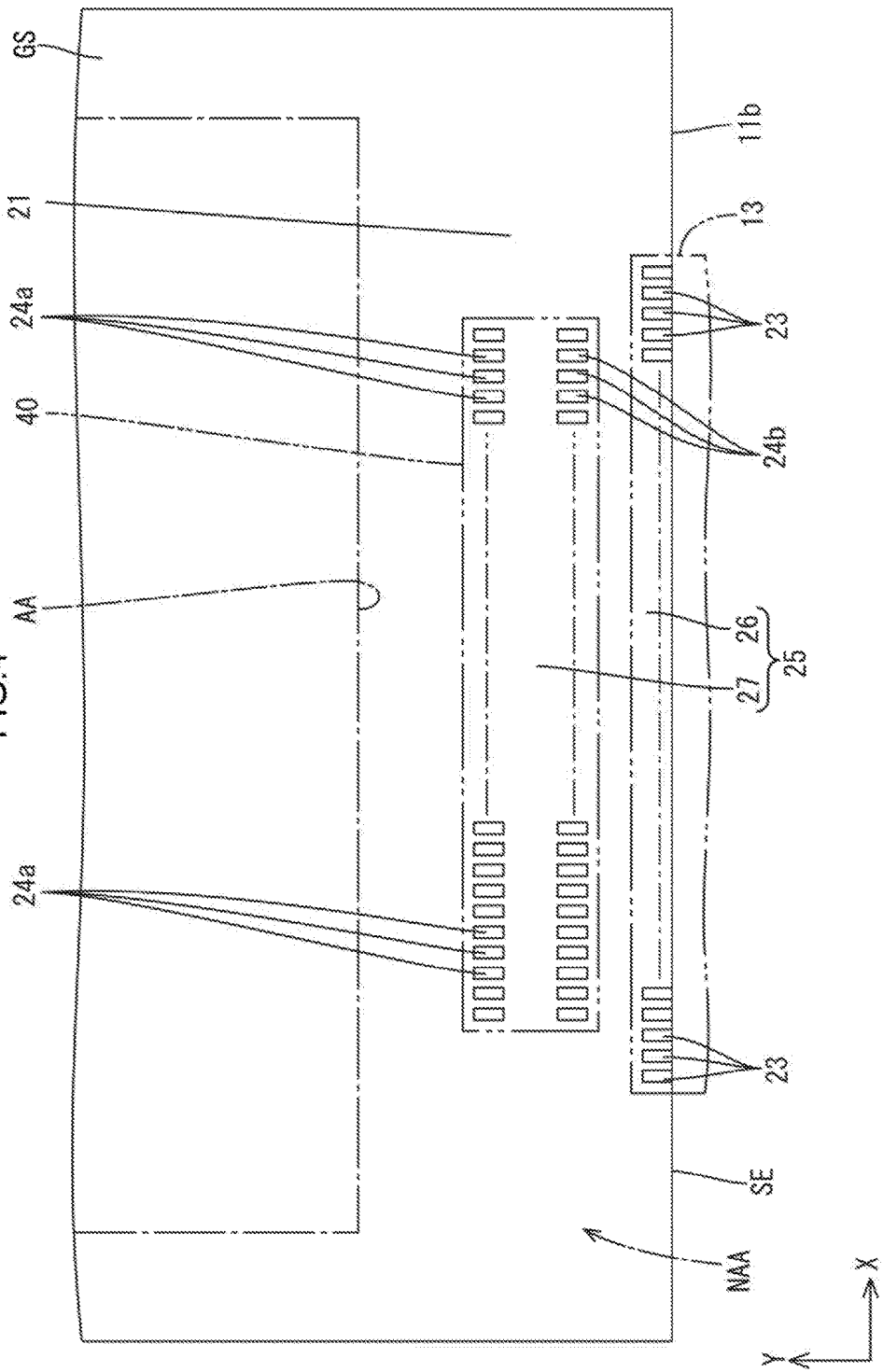
FIG. 4 is a schematic plan view illustrating a mounting area of an array substrate of the liquid crystal panel where the driver and the flexible printed circuit board are mounted.

As illustrated in FIG. 4, the non-display area NAA of the array substrate 11b includes a non-overlapping portion that is not overlapped with the CF substrate 11a. The non-overlapping portion includes a terminal forming portion 25 where panel-side driver terminals (electronic component terminals) 24a, 24b and panel-side flexible printed circuit board terminals (flexible printed circuit board terminals) 23 are formed. The driver 40 and the flexible printed circuit board 30 are connected to the panel-side driver terminals 24a, 24b and the panel-side flexible printed circuit board terminals 23, respectively. As illustrated in FIG. 1, the edge portion 31 of the flexible printed circuit board 30 and the driver 40 are mounted on the terminal forming portion 25. The edge portion 31 of the flexible printed circuit board 30 is arranged on an edge portion SE of the array substrate 11b along a short side thereof. The driver 40 is arranged on an inner side (closer to the display area AA) from the flexible printed circuit board 30 on the array substrate 11b. The edge portion 31 of the flexible printed circuit board 30 is mounted on a middle portion in a short-side edge portion SE of the array substrate 11b. The mounted edge portion 31 of the flexible printed circuit board 30 extends along the short-side edge portion SE (the X-axis direction) of the array substrate 11b. A dimension of the edge portion 31 of the flexible printed circuit board 30 mounted on the array substrate 11b is greater than a long-side dimension of the driver 40. The edge portion 31 of the flexible printed circuit board 30 and the driver 40 are mounted in a middle portion of the non-display area NAA with respect to the short-side direction of the array substrate 11b such that the extending direction (long-side direction) of the driver 40 corresponds with the short-side direction of the array substrate 11b (the X-axis direction).

Figure 5:
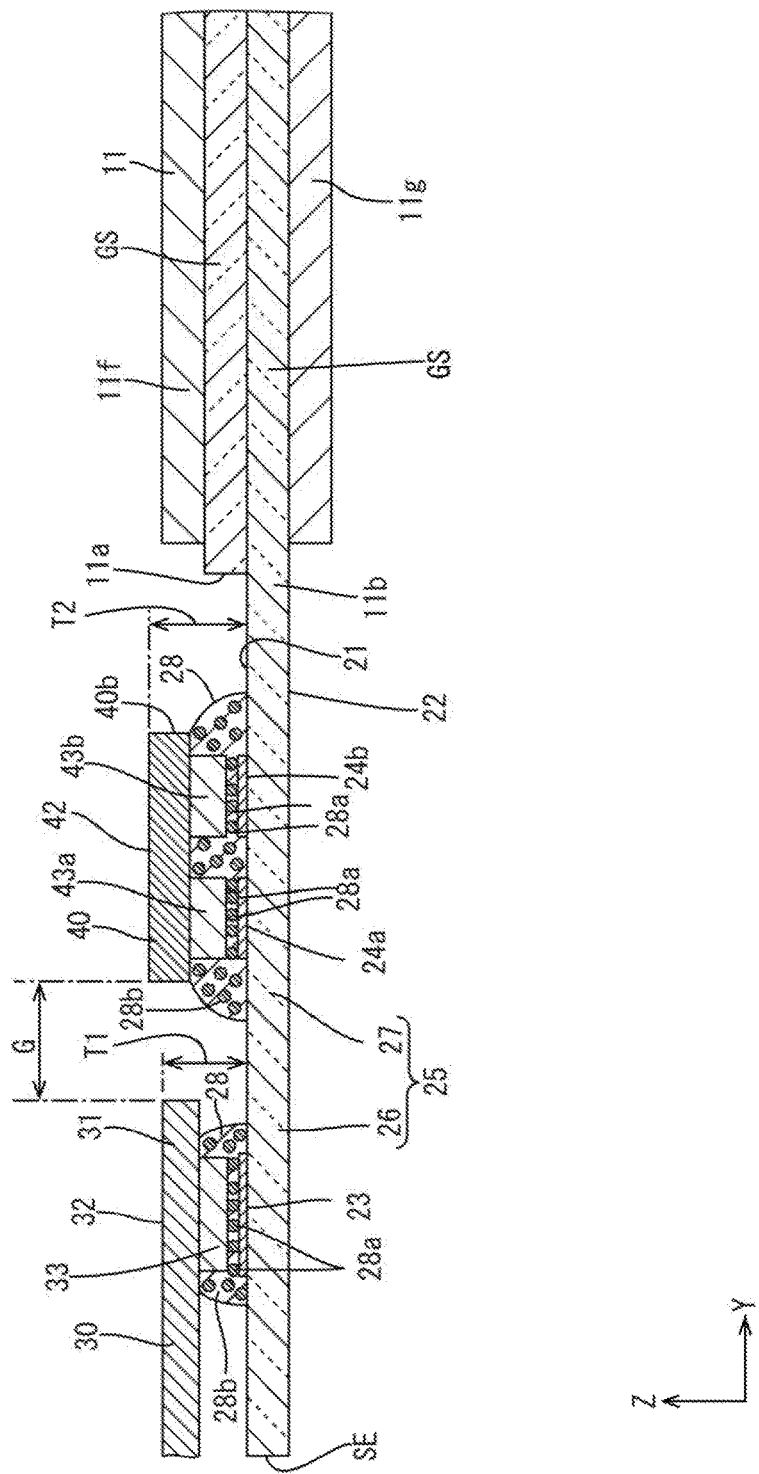
FIG. 5 is a cross-sectional view taken along line V-V in FIG. 1.

As illustrated in FIG. 5, each of the panel-side flexible printed circuit board terminals 23 and the panel-side driver terminals 24a, 24b is made of a metal thin film similar to that of the gate lines and the source lines, and surfaces of the metal thin film is covered with transparent electrode material such as ITO or ZnO same as the pixel electrode 18. Therefore, the panel-side terminals 23, 24a, 24b are formed on the array substrate 11b with the known photolithography method at a same time when the gate lines or the source lines, and the pixel electrodes 18 are formed with patterning in a process of manufacturing the liquid crystal panel 11 (the array substrate 11b). An anisotropic conductive film (ACF, anisotropic conductive material) 28 is arranged on the panel-side terminals 23, 24a, 24b. The panel-side terminals 23, 24a, 24b are electrically connected to the flexible printed circuit board side terminals 33 and the driver side terminals 43a, 43b, respectively via conductive particles 28a contained in the anisotropic conductive film 28. The anisotropic conductive film 28 includes the conductive particles 28a made of metal material and thermosetting resin 28b in which the conductive particles 28a are dispersed. The panel-side terminals 23, 24a, 24b are connected to the flexible printed circuit board side terminals 33 and the driver side terminals 43a, 43b, respectively, via the anisotropic conductive film 28 by mounting the flexible printed circuit board 30 and the driver 40 on the glass substrate GS of the array substrate 11b using a driver and flexible printed circuit board mounting apparatus 50, which will be described in detail later.

The panel-side flexible printed circuit board terminals 23 receive input signals from the flexible printed circuit board 30 and as illustrated in FIG. 4, the panel-side flexible printed circuit board terminals 23 are disposed in a portion of the array substrate 11b overlapping the edge portion 31 of the flexible printed circuit board 30 with a plan view. The panel-side flexible printed circuit board terminals 23 are arranged linearly in the X-axis direction or along the edge portion SE of the array substrate 11b with a certain distance therebetween.

The panel-side driver terminals 24a are configured to supply input signals to the driver 40 and the panel-side driver terminals 24b are configured to receive output signals from the driver 40. As illustrated in FIG. 4, the panel-side driver terminals 24a and the panel-side driver terminals 24b are arranged to overlap the driver 40 on the array substrate 11b with a plan view. The panel-side driver terminals 24a and the panel-side driver terminals 24b are arranged in the Y-axis direction (in a direction that the driver 40 and the display area AA (the flexible printed circuit board 30) are arranged) with a certain distance therebetween. The panel-side driver terminals 24a are arranged closer to the flexible printed circuit board 30 (on an opposite side from a display area AA side) in a driver 40 mounting area of the array substrate 11b, and the panel-side driver terminals 24b are closer to the display area AA (on an opposite side from a flexible printed circuit board 30-side). As illustrated in FIG. 4, the panel-side driver terminals 24a, 24b are arranged linearly in the X-axis direction or along the edge portion SE of the array substrate 11b with a certain distance therebetween.

As illustrated in FIG. 4, the panel-side flexible printed circuit board terminals (flexible printed circuit board terminals) 23 are formed in an area of the terminal forming portion 25 and the area is a flexible printed circuit board mounting portion 26 where the flexible printed circuit board 30 is mounted. The panel-side driver terminals (electronic component terminals) 24a, 24b are formed in another area of the terminal forming portion 25 and the area is a driver mounting portion 27 where the driver 40 is mounted. Relay traces (not illustrated) are arranged in the terminal forming portion 25 and between the flexible printed circuit board mounting portion 26 and the driver mounting portion 27, and the panel-side flexible printed circuit board terminals 23 and the panel-side driver terminals 24a, 24b are electrically connected to each other via the relay traces. The flexible printed circuit board 30 includes the flexible printed circuit board side terminals 33 that are to be connected to the respective panel-side flexible printed circuit board terminals 23. The driver 40 includes driver-side terminals (mounting component-side input terminals) 43a and driver-side terminals (mounting component-side output terminals) 43b. The driver-side terminals 43a are electrically connected to the panel-side driver terminals 24a, and the driver-side terminals 26 are electrically connected to the panel-side driver terminals 24b. In FIG. 4, the flexible printed circuit board 30 and the driver 40 are illustrated with two-dot chain lines. In FIG. 4, a dashed line indicates an outer boundary of the display area AA and the area outside the chain line is the non-display area NAA.

As illustrated in FIG. 5, the flexible printed circuit board side terminals 33 include exposed portions of traces at the edge portion 31 of the flexible printed circuit board 30. The flexible printed circuit board side terminals 33 are configured to transmit the signals from an external signal supply source to the relay traces (not illustrated) that are connected to the driver-side input terminals 25 of the driver 40. Similarly to the panel-side flexible printed circuit board terminals 23 illustrated in FIG. 4, the flexible printed circuit board side terminals 33 are arranged linearly in the X-axis direction or along the edge portion 31 with a certain distance therebetween.

As illustrated in FIG. 5, the driver-side terminals 43a and the driver-side terminals 43b are made of metal material having good conductivity such as gold and are metal bumps (projections) that project from a bottom surface (a surface opposite the array substrate 11b) of the driver 40. The driver-side terminals 43a, 43b are connected to a processing circuit included in the driver 40. Input signals are input via the driver-side terminals 43a and processed with the processing circuit and the signals are output to the driver-side terminals 43b. Similarly to the panel-side driver terminals 24a, 24b, the driver-side terminals 43a and the driver-side terminals 43b are arranged linearly in the X-axis direction or along the long side direction of the driver 40 with a certain distance therebetween.

The liquid crystal display device 10 has been required to be reduced in size of a frame portion and accordingly, the terminal forming portion 25 of the array substrate 11b has been required to be reduced in a width dimension thereof. The panel-side flexible printed circuit board terminals 23 and the panel-side driver terminals 24a, 24b are formed on the terminal forming portion 25. Therefore, as illustrated in FIG. 5, the liquid crystal panel 11 has a small-sized frame and a space between the driver 40 and the flexible printed circuit board 30, that is a dimension G from an outer edge portion of the driver 40 (a flexible printed circuit board 30 side edge portion) to the edge portion 31 of the flexible printed circuit board 30 (a driver side edge portion) is not greater than 0.6 mm. In a configuration of very small-sized frame that is required to be reduced in a frame size, the dimension G is 0.3 mm or 0.25 mm (0.25 mm≤G≤0.6 mm). With such a configuration, it is difficult to match the positions of the driver pressing surface of the pressing head and the driver and the positions of the flexible printed circuit board pressing surface and the flexible printed circuit board with the conventional method of mounting the driver and the flexible printed circuit board using one mounting apparatus (one pressing head). If the positions do not match, a portion that applies pressure and heat to the flexible printed circuit board may be unintentionally in contact with the driver and mounting errors of the driver or/and the flexible printed circuit board may be caused.

Figure 7:
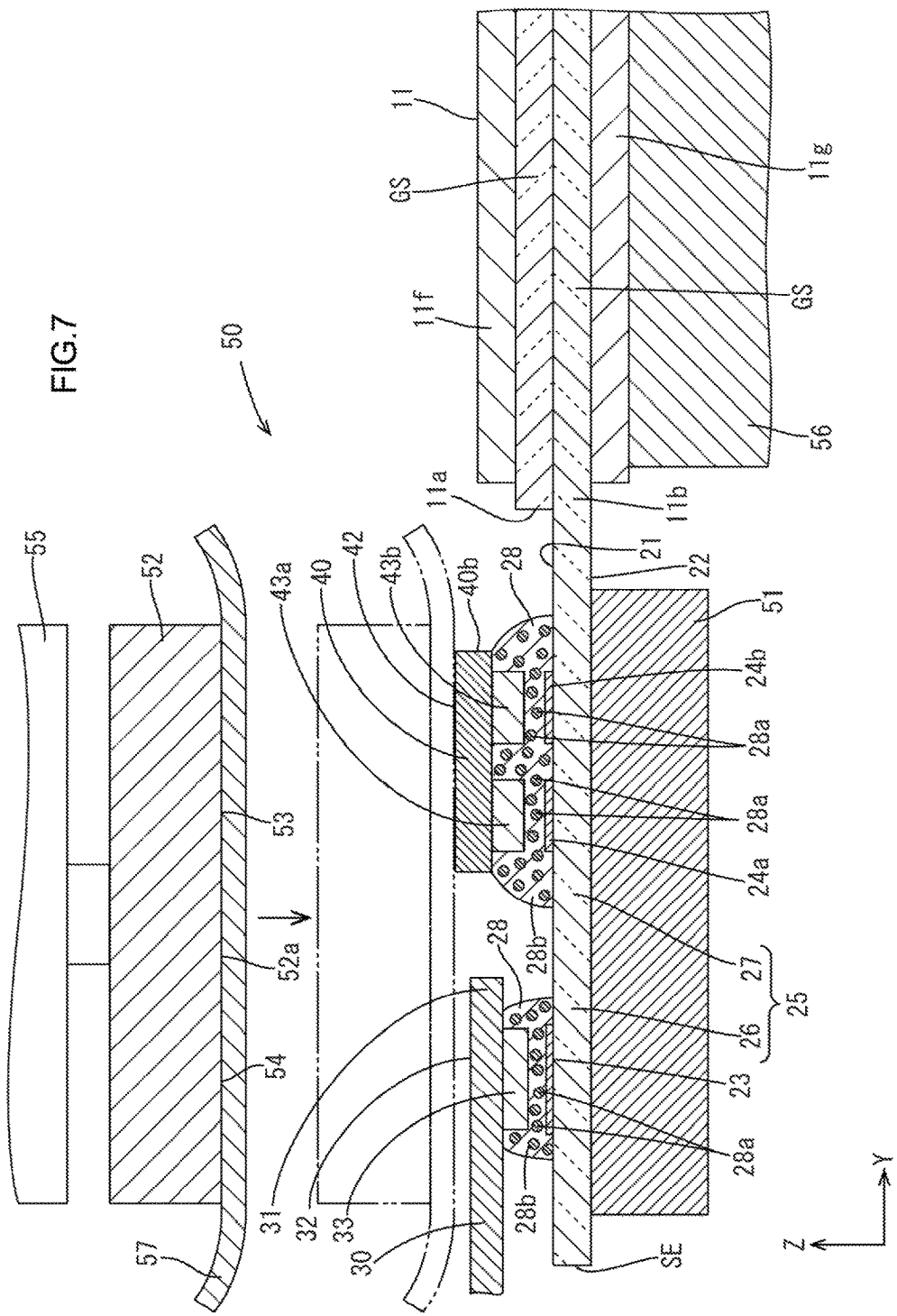
FIG. 7 is a cross-sectional view of a driver and flexible printed circuit board mounting apparatus before thermally pressing the driver and the flexible printed circuit board.
Figure 8:
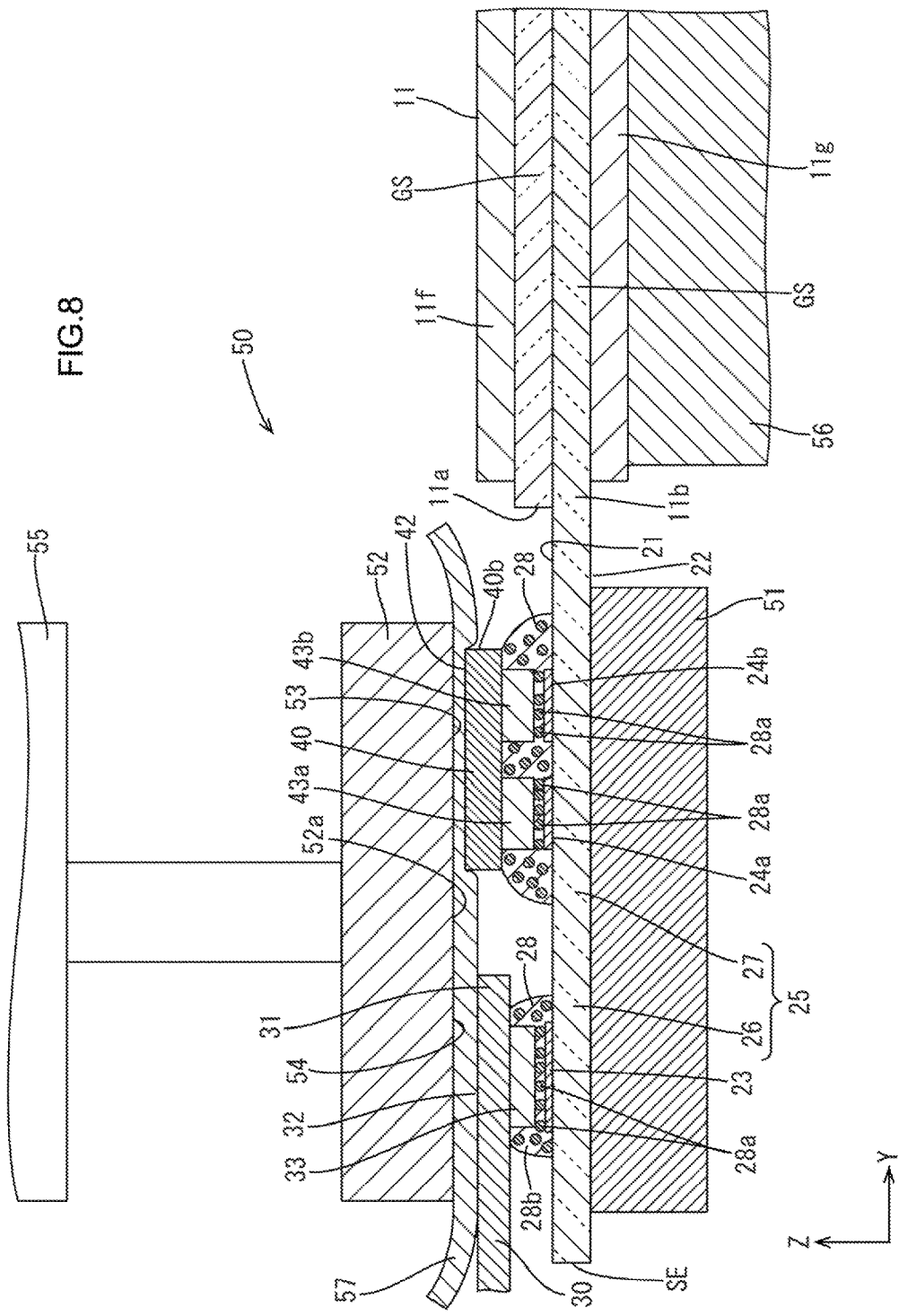
FIG. 8 is a cross-sectional view of the driver and flexible printed circuit board mounting apparatus that thermally presses the driver and the flexible printed circuit board.

In the present embodiment, the driver and flexible printed circuit board mounting apparatus 50 used for mounting the driver 40 and the flexible printed circuit board 30 on the glass substrate GS to be the array substrate 11b has a following configuration. As illustrated in FIGS. 7 and 8, the driver and flexible printed circuit board mounting apparatus 50 includes a substrate support portion 51, the pressing head 52, and a lifting/lowering device (moving means) 55. The substrate support portion 51 supports the glass substrate GS from another plate surface 22 side and the flexible printed circuit board 30 and the driver 40 are mounted on the mounting surface 21 of the glass substrate GS. The pressing head 52 is arranged on a mounting surface 21 side of the glass substrate GS and includes the driver pressing surface 53 for pressing the driver 40 against the substrate support portion 51 and a flexible printed circuit board pressing surface 54 for pressing the flexible printed circuit board 30 against the substrate support portion 51. The pressing head 52 has an opposing surface 52a that is opposite the mounting surface 21 of the glass substrate GS and is a flat surface. The opposing surface 52a, the driver pressing surface 53, and the flexible printed circuit board pressing surface 54 are on a same plane. The lifting/lowering device 55 moves the pressing head 52 closer to the glass substrate GS. The pressing head 52 is moved such that the driver pressing surface 53 and the flexible printed circuit board pressing surface 54 are at a same height level with respect to the mounting surface 21 of the glass substrate GS. The lifting/lowering device 55 applies a pressure force to the flexible printed circuit board 30 and the driver 40 with elastically deforming a buffer 57 that is between the driver pressing surface 53 and the driver 40 and between the flexible printed circuit board pressing surface 54 and the flexible printed circuit board 30. In the present embodiment, the driver 40 and the glass substrate GS are arranged in a vertical direction (the Z-axis direction) and the flexible printed circuit board 30 and the glass substrate GS are arranged in the vertical direction. The liquid crystal panel 11 supported by the substrate support portion 51 has a plate surface (along the Z-axis direction and the Y-axis direction) that is along a horizontal direction.

The driver and flexible printed circuit board mounting apparatus 50 further includes a support base 56 for supporting the glass substrate GS. The support base 56 supports most part of the glass substrate GS except for the terminal forming portion 25 (specifically, a part of the array substrate 11b overlapping the CF substrate 11a) from a same side as the substrate support portion 51. The support base 56 supports the glass substrate GS by vacuum sucking the glass substrate GS via a polarizing plate.

As illustrated in FIGS. 7 and 8, the substrate support portion 51 and the pressing head 52 configure a pressing mechanism that sandwich the driver 40 and the glass substrate GS, the edge portion 31 of the flexible printed circuit board 30 and the glass substrate GS between the substrate support portion 51 and the pressing head 52 and press them. The substrate support portion 51 is not movable in the Z-axis direction that is the arrangement direction in which the driver 40 and the glass substrate GS are arranged and the arrangement direction in which the edge portion 31 of the flexible printed circuit board 30 and the glass substrate GS are arranged. The pressing head 52 is movable in the Z-axis direction by the lifting/lowering device 55 and the pressing head 52 is moved closer to the substrate support portion 51 to press the driver 40 and the flexible printed circuit board 30. The driver-side terminals 43a, 43b are electrically connected to the respective panel-side driver terminals 24a, 24b and the flexible printed circuit board side terminals 33 are electrically connected to the respective panel-side flexible printed circuit board terminals 23 via the conductive particles 28a contained in the anisotropic conductive film 28 by pressure force applied from the pressing mechanism to the driver 40 and the flexible printed circuit board 30. The substrate support portion 51 and the pressing head 52 include heat supply means (heating means). Heat is transferred to the driver 40, the flexible printed circuit board 30, and the glass substrate GS by the heat supply means and the thermosetting resin 28b included in the anisotropic conductive film 28 that is between the glass substrate GS and each of the driver 40 and the flexible printed circuit board 30 can be thermally cured.

As illustrated in FIGS. 7 and 8, the substrate support portion 51 is arranged on the rear with respect to the glass substrate GS to be the array substrate 11b to support the driver mounting portion 27 from the rear side. The substrate support portion 51 receive from the rear side the driver 40 and the driver mounting portion 27 that are pressed by the pressing head 52. The substrate support portion 51 is made of metal material as a whole to have good mechanical strength and thermal conductivity and includes a heater inside thereof as the heat supply means (heating means). The terminal forming portion 25 received by the substrate support portion 51 is a part of the glass substrate GS to be the array substrate 11b except for the main portion of the substrate (specifically, a part of the glass substrate GS not overlapping the CF substrate 11a).

As illustrated in FIGS. 7 and 8, the pressing head 52 is arranged on the front with respect to the glass substrate GS to be the array substrate 11b, that is, on an opposite side from the support base 41 and the substrate support portion 51. The pressing head 52 is arranged to overlap the driver 40 and the flexible printed circuit board 30 with having the buffer 57 between the pressing head 52 and each of the driver 40 and the flexible printed circuit board 30. The pressing head 52 is made of metal material as a whole to have good mechanical strength and thermal conductivity and includes a heater inside thereof as heat supply means (heating means). Further, the pressing head 52 is supported by the lifting/lowering device 55 to be movable in the Z-axis direction. Accordingly, the pressing head 52 is relatively movable to be closer to or farther away from the driver 40 and the edge portion 31 of the flexible printed circuit board 30 placed on the substrate support portion 51 and the glass substrate GS.

As illustrated in FIGS. 7 and 8, the pressing head 52 has a lower surface that is an opposing surface 52a opposing the mounting surface 21 of the glass substrate GS. The opposing surface 52a is a flat surface extending in a horizontal direction and collectively presses the driver 40 and the edge portion 31 of the flexible printed circuit board 30 illustrated by a two dot chain line in FIG. 4. Specifically, the opposing surface 52a has a rectangular shape that overlaps an entire area of the driver-side pressed surface 42 and an entire area of the flexible printed circuit board side pressed surface 32 and that is greater than an area including the pressed surfaces 32, 42. A driver 40 side edge portion of the opposing surface 52a is on an inner side (on an opposite side from the flexible printed circuit board 30 side) from the edge of the driver-side pressed surface 42 with respect to the Y-axis direction (the arrangement direction in which the driver 40 and the flexible printed circuit board 30 are arranged). A flexible printed circuit board 30 side edge portion of the opposing surface 52a is on an outer side (on an opposite side from the driver 40 side) from the edge of the flexible printed circuit board-side pressed surface 32 with respect to the Y-axis direction. Edges of the opposing surface 52a with respect to the X-axis direction (the extending direction of the driver-side pressed surface 42 and the extending direction of the flexible printed circuit board side pressed surface 32) are on an outer side than one of the driver-side pressed surface 42 and the flexible printed circuit board side pressed surface 32 that extends more outward than the other one (in the present embodiment, the flexible printed circuit board side pressed surface 32 on both ends with respect to the X-axis direction). Namely, the opposing surface 52a has a size dimension with respect to the X-axis direction so as to extend further outward from the edge of each of the driver 40 and the flexible printed circuit board 30 according to the shape and the arrangement thereof. Therefore, even if the position of the pressing head 52 does not match the position of the driver 40 or the flexible printed circuit board 30, both of the driver 40 and the flexible printed circuit board 30 are surely pressed by the pressing head 52. The phrase that the pressing head 52 extends outward means that the pressing head 52 that is overlapped with the driver 40 or the flexible printed circuit board 30 has an extra area that can absorb the error by the extended amount of the pressing head 52.

The lifting/lowering device (the moving means) 55 supports the pressing head 52 so as to be movable in the Z-axis direction. The lifting/lowering device 55 lifts or lowers the pressing head 52 with keeping the opposing surface 52a of the pressing head in a horizontal state and adjusts the speed of lifting/lowering (a moving speed) of the pressing head 52. The lifting/lowering device 55 is configured to lower the pressing head 52 to apply a load (a thrust force) to the driver 40 and the flexible printed circuit board 30 via the buffer 57. In lowering of the lifting/lowering device 55, the pressing head 52 is moved such that relation between the mounting surface 21 of the glass substrate GS and each of the driver pressing surface 53 and the flexible printed circuit board pressing surface 54 is same. Accordingly, the load applied to each of the driver 40 and the flexible printed circuit board 30 per a unit area is substantially same.

The buffer 57 is made of synthetic resin that is elastically deformable. For example, resin material such as polytetrafluoroethylene (Teflon (registered trademark)), polyimide, aramid is formed in a sheet to obtain the buffer 57. The buffer 57 has a thickness of approximately from 0.10 mm to 0.015 mm and is configured to absorb a height difference between the driver-side pressed surface 42 and the flexible printed circuit board side pressed surface 32. The buffer 57 reduces the load that is applied to the driver 40 and the flexible printed circuit board 30 by the pressing head 52, and the driver 40 and the flexible printed circuit board 30 are protected. The buffer 57 may be previously arranged on the driver 40 and the flexible printed circuit board 30, or the driver and flexible printed circuit board mounting apparatus 50 may include a buffer arrangement portion (not illustrated) where the buffer 57 is arranged and the buffer 57 may be arranged if necessary.

Next, a method of manufacturing a liquid crystal panel 11 with using the above-structured driver and flexible printed circuit board mounting apparatus 50 will be described. The method of manufacturing the liquid crystal panel 11 includes at least a structured components forming process, a substrate thinning process, a substrate bonding process, a polarizing plate attachment process, a terminal cleaning process, and a driver and a flexible printed circuit board mounting process (an electronic component and flexible printed circuit board mounting process). In the structured components forming process, metal films and insulation films are layered on an inner plate surface of each glass substrate GS of the CF substrate 11a and the array substrate 11b with the known photolithography method to form various structured components including the panel-side flexible printed circuit board terminals 23 and the panel-side driver terminals 24a, 24b. In the substrate thinning process, the outer plate surface of the glass substrate GS having the structured components thereon is processed with etching and the glass substrate GS is reduced in thickness. In the substrate bonding process, the glass substrate GS to be the CF substrate 11a and the glass substrate GS to be the array substrate 11b are bonded together. In the polarizing plate attachment process, the polarizing plates 11f, 11g are attached to the respective outer plate surfaces of the glass substrates GS. In the terminal cleaning process, the panel-side flexible printed circuit board terminals 23 and the panel-side driver terminals 24a, 24b formed on the terminal forming portion 25 of the array substrate 11b are cleaned. In the driver and flexible printed circuit board mounting process, the driver 40 and the flexible printed circuit board 30 are mounted on the terminal forming portion 25 of the glass substrate GS with using the driver and flexible printed circuit board mounting apparatus 50. The driver and flexible printed circuit board mounting process further includes at least an anisotropic conductive film applying process, a provisional pressing process, a positioning process, a driver pressing process (an electronic component pressing process), and a flexible printed circuit board pressing process (a flexible printed circuit board pressing process). In the anisotropic conductive film applying process, the anisotropic conductive film 28 is applied on the driver mounting portion 27 and the flexible printed circuit board mounting portion 26 of the glass substrate GS. In the provisional pressing process, the driver 40 and the flexible printed circuit board 30 are arranged on the anisotropic conductive film 28 and provisionally pressed. In the positioning process, the provisionally pressed driver 40 and flexible printed circuit board 30 are positioned with respect to the pressing head 52. In the driver pressing process, the driver 40 is thermally pressed against the glass substrate GS. In the flexible printed circuit board pressing process, the flexible printed circuit board 30 is thermally pressed against the glass substrate GS. Hereinafter, each process of the driver and flexible printed circuit board mounting process will be described in detail.

Figure 6:
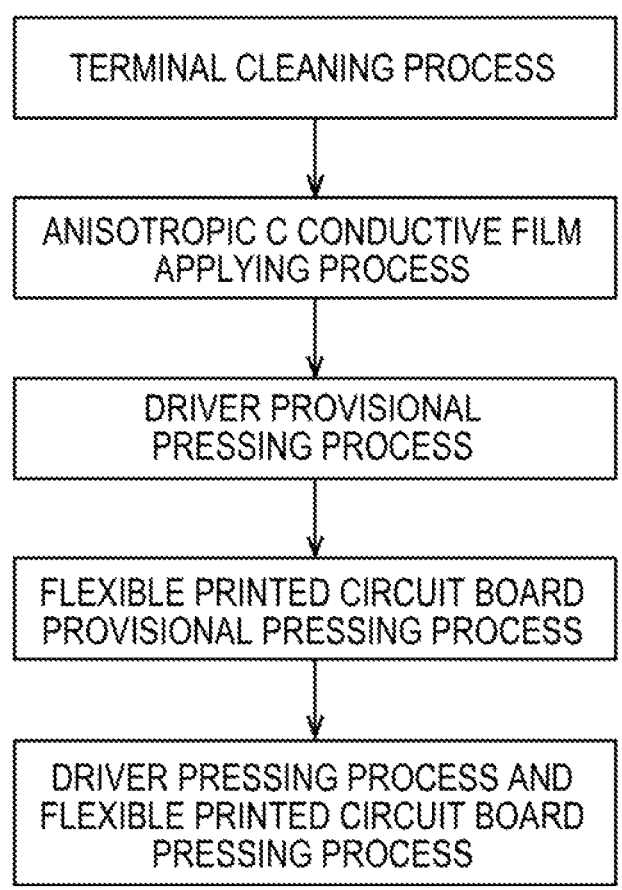
FIG. 6 is a flowchart illustrating a process of mounting a driver and a flexible printed circuit board.

The driver mounting process and the flexible printed board mounting process are performed with using different devices in the conventional method and the processes are performed in the following sequence. First, as the driver mounting process, the terminal cleaning process, the anisotropic conductive film applying process (only for the driver), the provisional pressing process of the driver, and the driver pressing process are sequentially performed. Subsequently, as the flexible printed circuit board mounting process, the anisotropic conductive film applying process (only for the flexible printed circuit board), the provisional pressing process of the flexible printed circuit board, and the flexible printed circuit board pressing process are sequentially performed. In the present embodiment, the driver and flexible printed circuit board mounting process is performed with using one driver and flexible printed circuit board mounting apparatus 50. Therefore, as illustrated in FIG. 6, the terminal cleaning process, the anisotropic conductive film applying process (for both of the driver 40 and the flexible printed circuit board 30), the provisional pressing process of the driver 40, the provisional pressing process of the flexible printed circuit board 30, and the pressing process of the driver 40 and the flexible printed circuit board 30 are sequentially performed.

In the anisotropic conductive film applying process, the anisotropic conductive film 28 having a substantially same size as that of the driver mounting portion 27 is arranged to match the position of the driver mounting portion 27, and the anisotropic conductive film 28 having a substantially same size as that of the flexible printed circuit board mounting portion 26 is arranged to match the position of the flexible printed circuit board mounting portion 26. The anisotropic conductive films 28 are made of same kind of anisotropic conductive material and able to be mounted with pressure under similar conditions of temperature and pressure. In a conventional method, if a driver mounting process and a flexible printed circuit board mounting process are executed sequentially with different devices, the anisotropic conductive film that is to be thermally pressed in a latter process may be cured by the heat that is applied for thermally pressing in a former process. The anisotropic conductive films 28 cannot be arranged on both of the driver mounting portion 27 and the flexible printed circuit board mounting portion 26 within a same tact. In the present embodiment, the driver pressing process and the flexible printed circuit board pressing process are executed simultaneously and the anisotropic conductive films 28 can be arranged at the same time.

The provisional pressing process of the driver 40 and the provisional pressing process of the flexible printed circuit board 30 are executed by pressing the driver 40 and the flexible printed circuit board 30 with heat such that the anisotropic conductive films 28 are not thermally cured. Regarding the provisionally pressing method, the driver 40 and the flexible printed circuit board 30 may be pressed simultaneously with using a provisionally pressing device (not illustrated) including an integrally-provided pressing head similarly to the driver and flexible printed circuit board mounting apparatus 50.

In the positioning process, a position of an inner side edge portion 40b (on an opposite side from the flexible printed circuit board 30 side) of the provisionally pressed driver 40 is detected by position obtaining means such as a camera (not illustrated) and the support base 41 is moved in the plate surface direction of the glass substrate GS (in the X-axis direction and the Y-axis direction, a horizontal direction) based on the position information. Accordingly, the inner side edge portion 40b of the driver 40 is positioned with respect to the pressing head 52. The pressing head 52 has an extra area that is outside the portion overlapping the driver-side pressed surface 42 and the flexible printed circuit board side pressed surface 32. In the present embodiment, no gap is provided between the driver pressing surface 53 and the flexible printed circuit board pressing surface 54. Therefore, the driver-side pressed surface 42 and the flexible printed circuit board side pressed surface 32 are positioned with respect to the pressing head 52 only by positioning the inner side edge portion 40b of the driver 40 with respect to the pressing head 52.

In the present embodiment, the driver pressing process and the flexible printed circuit board pressing process are executed simultaneously. As illustrated in FIG. 7, in the driver pressing process and the flexible printed circuit board pressing process, the pressing head 52 is lowered in the Z-axis direction (to be closer to the glass substrate GS) with the substrate support member 51 supporting the terminal forming portion 25 (the driver mounting portion 27 and the flexible printed circuit board mounting portion 26) of the glass substrate GS from another plate surface 22 side. Thus, a portion of the buffer 57 overlapping the driver 40 (the driver-side pressed surface 42) is in contact with the driver 40. The pressing head 52 is further lowered in the Z-axis direction and pressure force is applied to the driver-side pressed surface 42 with elastically deforming the portion of the buffer 57 that is in contact with the driver 40. The pressing head 52 is further lowered in the Z-axis direction with increasing the load applied to the driver 40 and a portion of the buffer 57 overlapping the edge portion 31 (the flexible printed circuit board side pressed surface 32) of the flexible printed circuit board 30 is in contact with the edge portion 31. From this state, the pressing head 52 is further lowered in the Z-axis direction and the pressure force is applied to the flexible printed circuit board side pressed surface 32 with elastically deforming the portion of the buffer 57 that is in contact with the flexible printed circuit board 30. In such a condition, pressure force is sequentially applied to the driver 40 and the flexible printed circuit board 30.

In the above process, the pressing head 52 and the substrate support portion 51 supply heat to the driver 40, the flexible printed circuit board 30, and the terminal forming portion 25 of the glass substrate GS. The heat supplied to the driver 40, the flexible printed circuit board 30, and the terminal forming portion 25 of the glass substrate GS is transferred to the thermosetting resin 28b included in the anisotropic conductive film 28 to accelerate the thermosetting resin 28b to be thermally cured. In such a state, the pressing head 52 is further lowered and pressure force is applied to the driver 40 and the driver mounting portion 27 that are between the substrate support portion 51 and the pressing head 52, the anisotropic conductive film 28 that is between the driver 40 and the driver mounting portion 27, the flexible printed circuit board 30 and the flexible printed circuit board mounting portion 26, and the anisotropic conductive film 28 that is between the flexible printed circuit board 30 and the flexible printed circuit board mounting portion 26. If the pressing head 52 is lowered and reaches a certain height position, the pressing head 52 is stopped and the application of the pressure force and the supply of heat are continued for a while (see FIG. 8). In such a condition, the opposing surface 52a of the pressing head 52 is parallel to the mounting surface 21 of the glass substrate GS and the driver pressing surface 53 and the flexible printed circuit board pressing surface 54 are at a same height from the mounting surface 21. Heat is supplied such that temperature of a connecting border surface between the driver-side terminals 43a, 43b and the panel-side driver terminals 24a, 24b and between the flexible printed circuit board side terminals 33 and the panel-side flexible printed circuit board terminals 23 is from 80° C. to 150° C. A load of 100N to 450N is applied to the driver mounting portion 27 and the flexible printed circuit board mounting portion 26. Accordingly, as illustrated in FIG. 5, the diver-side terminals 43a, 43b are electrically connected to the panel-side driver terminals 24a, 24b, respectively, via the conductive particles 28a contained in the anisotropic conductive film 28 and the thermosetting resin 28b contained in the anisotropic conductive film 28 is thermally cured effectively. Thus, the driver 40 is mounted with pressed on the driver mounting portion 27. Similarly, the flexible printed circuit board 30 is mounted with pressed on the flexible printed circuit board mounting portion 26. After completion of the thermal pressing of the driver 40 and the flexible printed circuit board 30, supply of heat from the pressing head 52 and the substrate support portion 51 is stopped and the pressing head 52 is lifted in the Z-axis direction. In the present embodiment, the driver pressing process and the flexible printed circuit board pressing process are executed simultaneously by lowering and lifting the pressing head 52 once.

Next, operations and effects of the present embodiment will be described.

According to the method of manufacturing the liquid crystal panel 11 (the array substrate 11b) of the present embodiment, the pressing is executed with one pressing head 52 such that the driver pressing surface 53 and the flexible printed circuit board pressing surface 54 are at a same height from the mounting surface 21 of the glass substrate GS in the driver pressing process and the flexible printed circuit board pressing process. Accordingly, a predetermined pressure force can be applied to the driver 40 and the flexible printed circuit board 30, even if the driver 40 and the flexible printed circuit board 30 may be arranged very close to each other (for example, 0.25 mm≤G≤0.6 mm) due to reduction in frame size of the liquid crystal display device 10 and the flexible printed circuit board pressing surface 54 may be in contact with the driver 40 or the driver pressing surface 53 may be in contact with the flexible printed circuit board 30. Therefore, the driver 40 and the flexible printed circuit board 30 can be surely mounted on the glass substrate GS.

In the manufacturing method of the present embodiment, the driver pressing process and the flexible printed circuit board pressing process are executed simultaneously. According to such a method, a portion where mounting is executed and the mounting portion of the substrate where the mounting is executed in one of the driver mounting process and the flexible printed circuit board mounting process are not heated again in another one of the processes after being cooled down, even if the driver 40 and the flexible printed circuit board 30 are arranged to be close to each other due to the reduction of frame size of the liquid crystal display device 10. Therefore, a bonding strength of the mounted portion is less likely to be lowered or unintentional reaction force is less likely to be generated due to deformation of the panel by re-heating of the mounted portion and the mounting portion of the substrate.

Specifically, if a certain space is provided between the driver 40 and the flexible printed circuit board 30, the space provides heat insulation effects between the driver mounting portion and the flexible printed circuit board mounting portion. Therefore, even if one of the driver mounting process and the flexible printed circuit board mounting process is executed earlier, the heat supplied in another one of the processes is less likely to affect the mounted portion and the mounting portion of the substrate that are subjected to the earlier one of the processes. However, the space G is reduced according to the reduction in frame size of the liquid crystal display device 10 and the effects of the heat supplied in another one of the processes to the mounted portion and the mounting portion of the substrate that are subjected to the earlier one of the processes cannot be ignored. Such effects will be described below in a case where the driver mounting process is executed first and the flexible printed circuit board mounting process is executed after cooling down the heat supplied in the thermal pressing in the former process. In such a case, the heat supplied in the thermal pressing in the flexible printed circuit board mounting process is transferred to a connection structure between the driver-side terminals 43a, 43b and the panel-side driver terminals 24 or the driver mounting portion 27 via the space G or the glass substrate GS. In the above connection structure, the anisotropic conductive film 28 is re-heated in non-pressed state and mechanical bonding strength between the driver 40 and the glass substrate GS by the anisotropic conductive film 28 may be lowered or the driver mounting portion 27 of the glass substrate GS may be deformed (warping) and unintentional reaction force may be applied to the connection structure. Thus, mounting errors of the driver 40 may be caused afterwards. Especially, in the thin glass substrate GS of the present embodiment, the above problem is likely to be caused. In the present embodiment, the driver pressing process and the flexible printed circuit board pressing process are executed simultaneously and therefore, the above-described mounting errors of the driver 40 or the flexible printed circuit board 30 are less likely to be caused.

In the positioning process of the manufacturing method of the present embodiment, the position of the inner side edge portion 40b of the driver 40 is detected and the position of the inner side edge portion 40b is positioned with respect to the pressing head 52. In the present embodiment, no step or no gap is provided at a border between the driver pressing surface 53 and the flexible printed circuit board pressing surface 54. Therefore, it is not necessary to position the border between the driver pressing surface 53 and the flexible printed circuit board pressing surface 54 of the pressing head 52 with respect to the position between the driver 40 and the flexible printed circuit board 30. Therefore, in the positioning process, positioning of the pressing head 52, the driver 40, and the flexible printed circuit board 30 are performed effectively only by positioning the inner side edge portion 40b of the driver 40 that is on an opposite edge portion from the flexible printed circuit board 30 with respect to the pressing head 52. Thus, the number of positioning parts in the positioning process is reduced and manufacturing efficiency is improved.

The manufacturing method of the present embodiment further includes the terminal cleaning process in which the driver mounting portion 27 and the flexible printed circuit board mounting portion 26 are collectively cleaned, and the anisotropic conductive film applying process in which the anisotropic conductive films 28, 28 are applied to the driver mounting portion 27 and the flexible printed circuit board mounting portion 26 that are cleaned, respectively, before the provisional pressing process. According to the method, after the terminal cleaning process, the anisotropic conductive films 28, 28 are applied to the driver mounting portion 27 and the flexible printed circuit board mounting portion 26, respectively, without being subjected to the driver pressing process or the flexible printed circuit board pressing process. Accordingly, foreign obstacles are less likely to be adhered on the driver mounting portion 27 and the flexible printed circuit board mounting portion 26 after the terminal cleaning process and before applying the anisotropic conductive films 28, 28.

According to the driver and flexible printed circuit board mounting apparatus 50 of the present embodiment, the driver 40 and the flexible printed circuit board 30 are thermally pressed with one pressing head 52 such that the driver pressing surface 53 and the flexible printed circuit board pressing surface 54 are at a same height with respect to the glass substrate GS to be the array substrate 11b. Even if the driver 40 and the flexible printed circuit board 30 may be arranged very close to each other due to reduction in frame size of the liquid crystal display device 10 and the flexible printed circuit board pressing surface 54 may be in contact with the driver 40, a predetermined pressing force can be applied to the flexible printed circuit board 30 and the driver 40. Therefore, the flexible printed circuit board 30 and the driver 40 can be surely mounted on the glass substrate.

<Second Embodiment>

Figure 9:
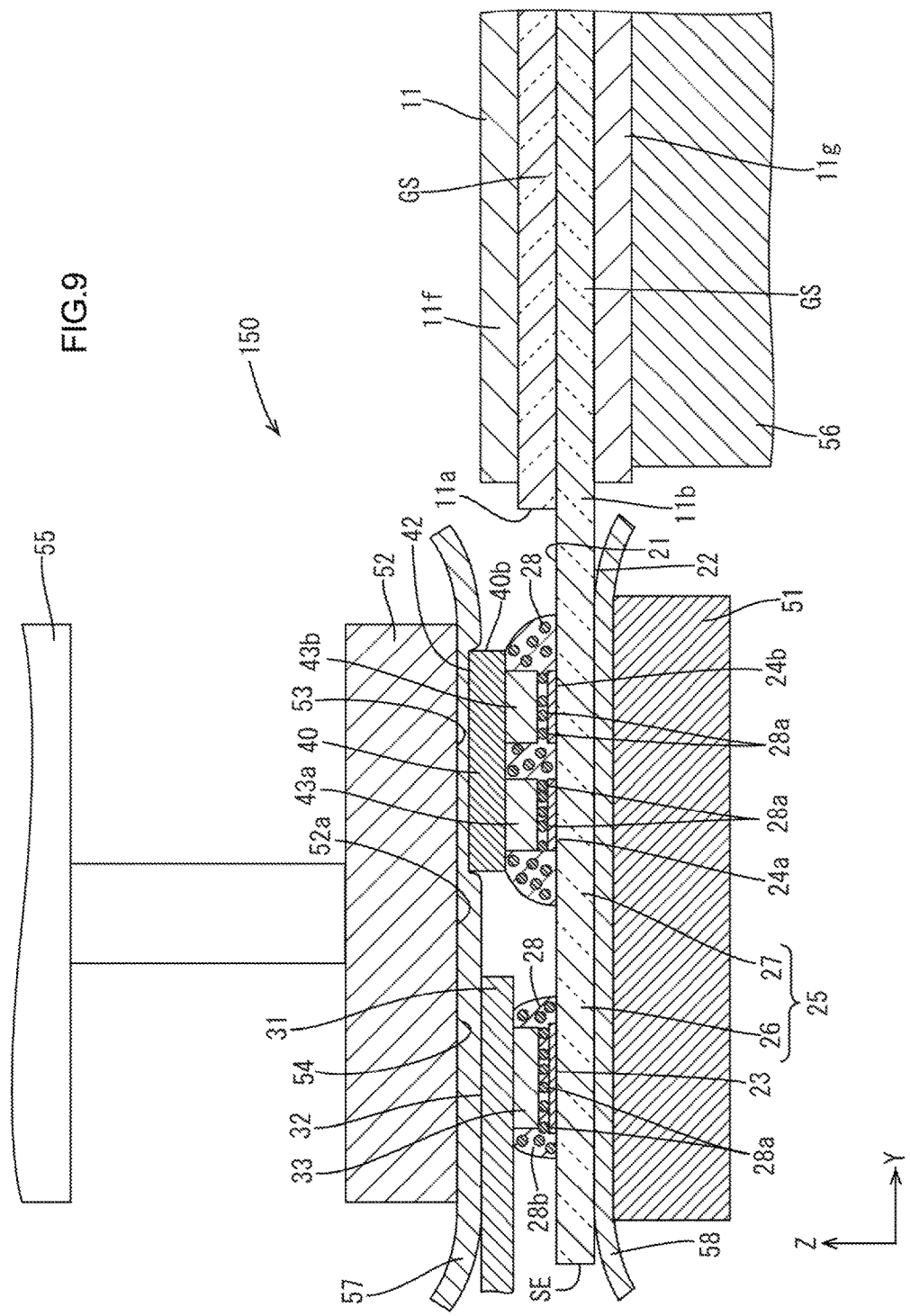
FIG. 9 is a cross-sectional view of a driver and flexible printed circuit board mounting apparatus according to a second embodiment that thermally presses a driver and a flexible printed circuit board.

A second embodiment of the present invention will be described with reference to FIG. 9. The second embodiment differs from the first embodiment in that a driver and flexible printed circuit board mounting apparatus 150 includes a base support portion-side buffer 58 between the substrate support portion 51 and the glass substrate GS to be the array substrate 11b. Configurations, operations, and effects similar to those in the first embodiment will not be described.

The substrate support portion 51 supports the glass substrate GS via the substrate support portion-side buffer 58 that is between the glass substrate GS to be the array substrate 11b and the substrate support portion 51. The substrate support portion-side buffer 58 is made of material same as that of the buffer 57 and has a thickness of approximately from 0.01 mm to 0.06 mm. According to such a configuration, the load applied to the driver mounting portion 27 and the flexible printed circuit board mounting portion 26 are reduced via the buffer 57 and the substrate support portion-side buffer 58 even if the driver 40 and the flexible printed circuit board 30 have different height dimensions.

<Third Embodiment>

A third embodiment of the present invention will be described with reference to FIGS. 10 to 13. In the third embodiment, the driver mounting process and the flexible printed circuit board mounting process are successively executed unlike the first embodiment. Configurations, operations, and effects similar to those in the first embodiment will not be described.

Figure 11:
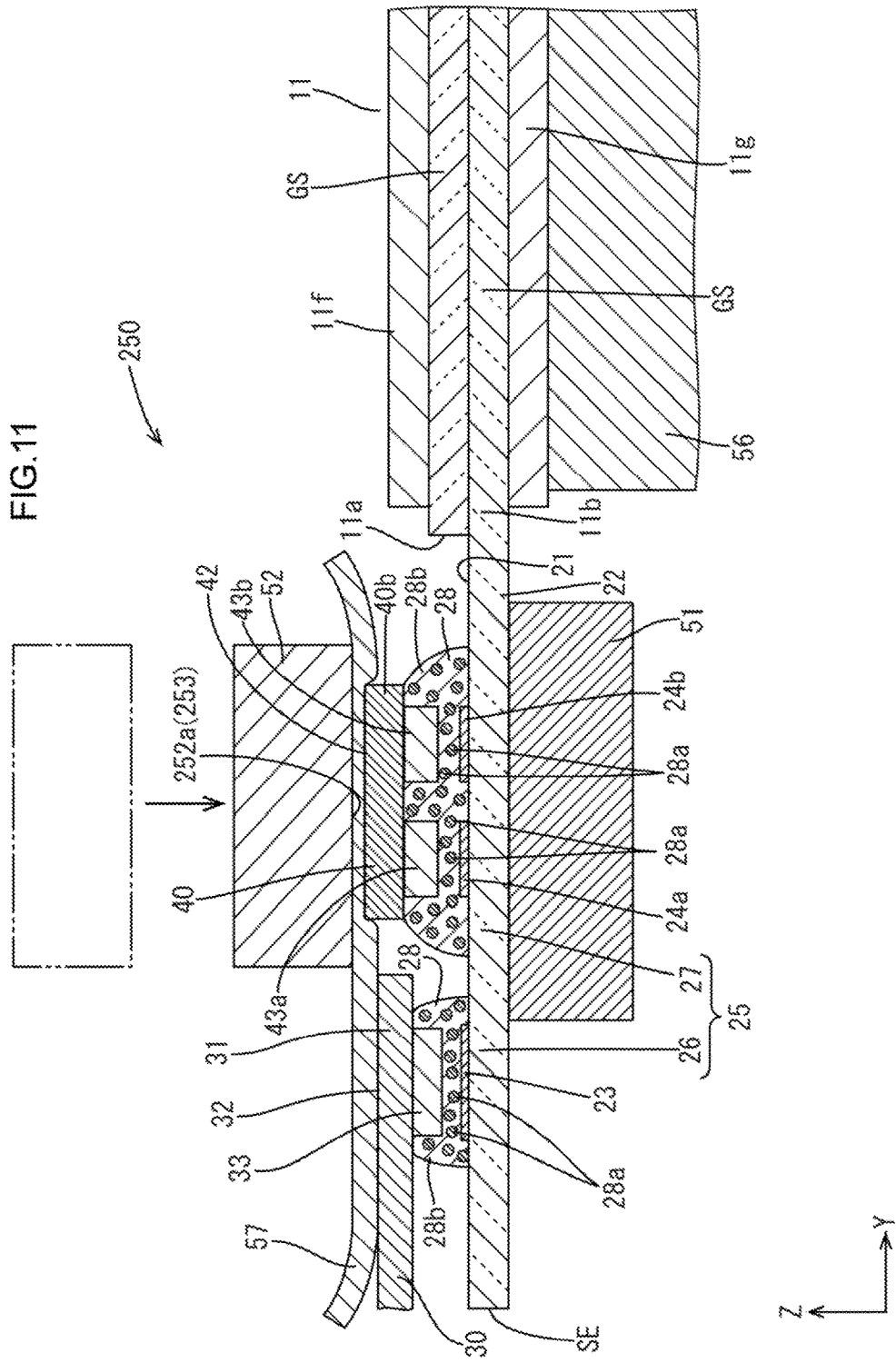
FIG. 11 is a cross-sectional view of the driver and flexible printed circuit board mounting apparatus that thermally presses the driver and the flexible printed circuit board.
Figure 12:
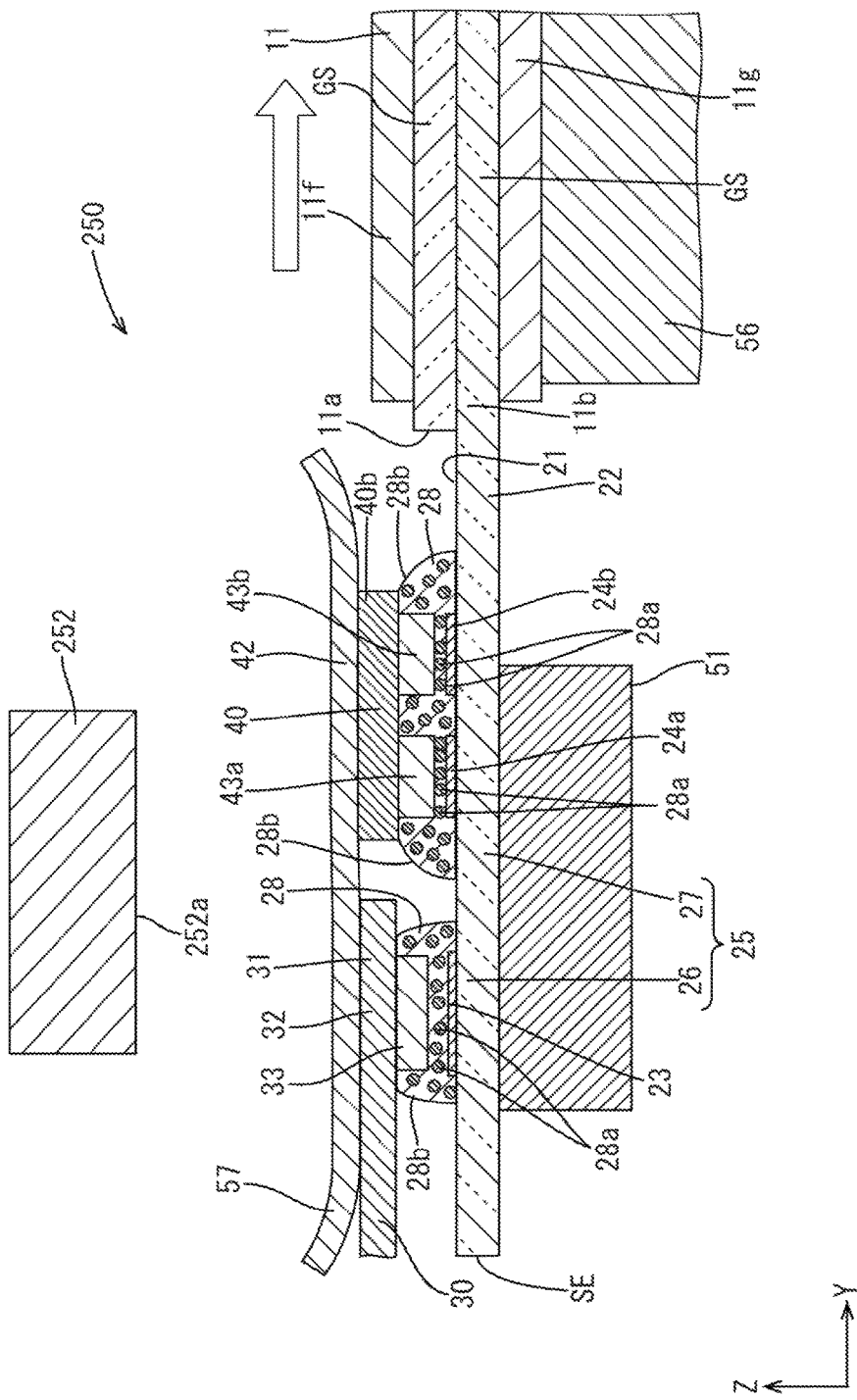
FIG. 12 is a cross-sectional view of the driver and flexible printed circuit board mounting apparatus where an array substrate is moved.
Figure 13:
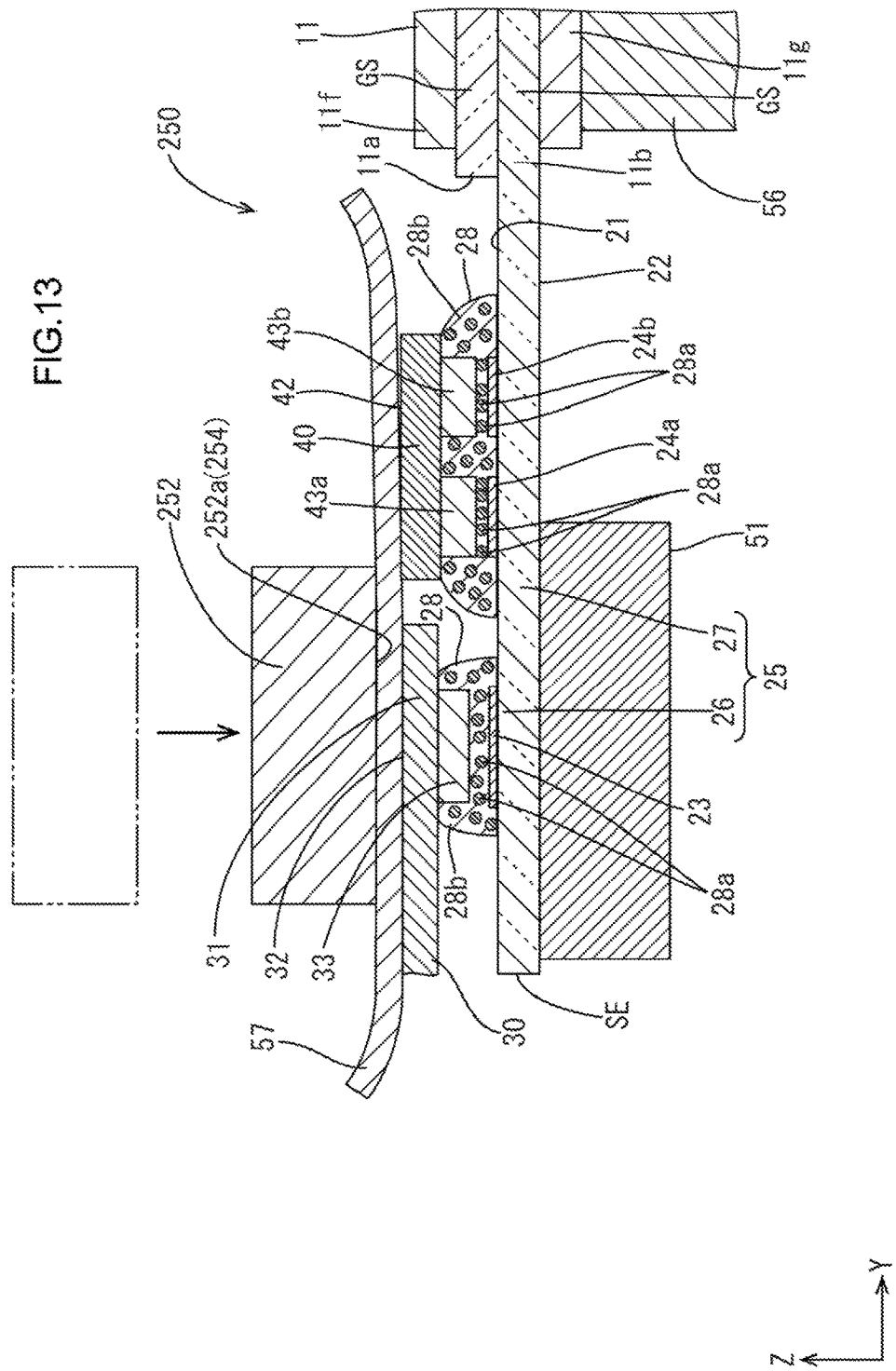
FIG. 13 is a cross-sectional view of the driver and flexible printed circuit board mounting apparatus that thermally presses the driver and the flexible printed circuit board.

The second embodiment differs from the first embodiment in that a driver and flexible printed circuit board mounting apparatus 250 includes a pressing head 252 that can press the driver 40 and the flexible printed circuit board 30 at different timings. As illustrated in FIGS. 11 and 13, the pressing head 252 has a lower surface that is an opposing surface 252a opposing the mounting surface 21 of the glass substrate GS. The opposing surface 252a is a flat surface extending in a horizontal direction and presses independently each of the driver 40 and the edge portion 31 of the flexible printed circuit board 30 illustrated by the two dot chain line in FIG. 4. Specifically, the opposing surface 252a is larger than the driver-side pressed surface 42 of the driver 40 and larger than the flexible printed circuit board side pressed surface 32 of the flexible printed circuit board 30. The lifting/lowering device that supports the pressing head 252 to be movable in the Z-axis direction has a configuration similar to that of the first embodiment and is not illustrated in the drawings.

Figure 10:
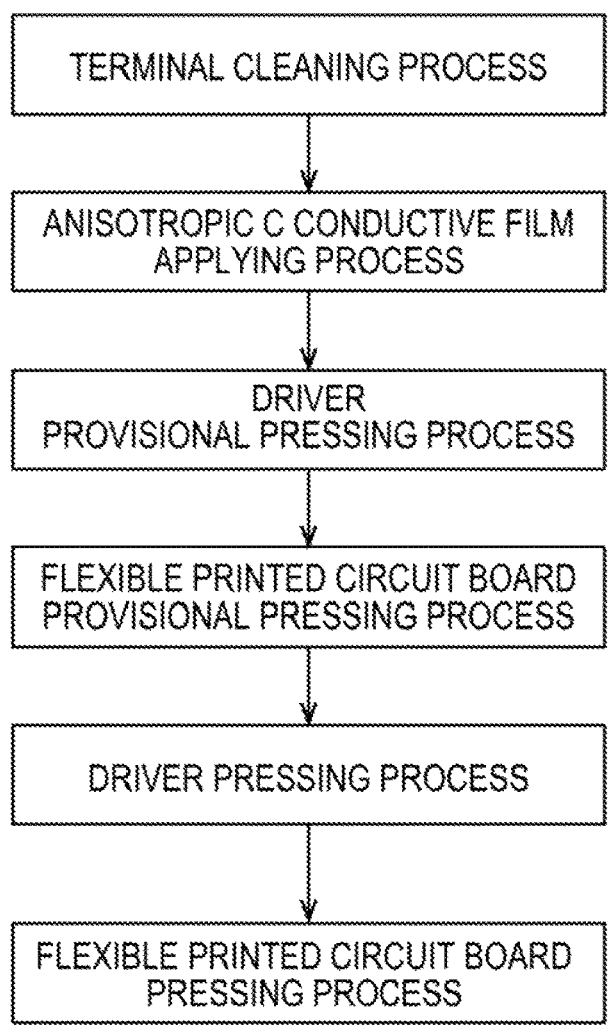
FIG. 10 is a flowchart illustrating a process of mounting a driver and a flexible printed circuit board according to a third embodiment.

According to a method of manufacturing a liquid crystal panel (the array substrate 11b) of the present embodiment, as illustrated in FIG. 10, the driver and flexible printed circuit board mounting process is executed with one driver and flexible printed circuit board mounting apparatus 250. Therefore, the terminal cleaning process, the anisotropic conductive film applying process (the driver 40 and the flexible printed circuit board 30), the provisional pressing process of the driver 40, the provisional pressing process of the flexible printed circuit board 30, the pressing process of the driver 40, and the pressing process of the flexible printed circuit board 30 are sequentially executed.

As illustrated in FIG. 11, in the driver pressing process, the pressing head 252 is lowered in the Z-axis direction (to be closer to the glass substrate GS) with the substrate support portion 51 supporting the driver mounting portion 27 of the glass substrate GS from the other surface 22 side, and the pressing head 252 comes in contact with a portion of the buffer 57 overlapping the driver 40 (the driver-side pressed surface 42). From this state, the pressing head 252 is further lowered in the Z-axis direction and applies pressure force to the driver-side pressed surface 42 with elastically deforming the contact portion of the buffer 57. The opposing surface 252*a* of the pressing head 252 functions as a driver pressing surface 253. The thermal pressing of the driver 40 is completed with the similar operations of the driver pressing process of the first embodiment and the pressing head 252 is lifted. The support base 56 is moved in a direction of a void arrow in FIG. 12 such that the glass substrate GS is moved with respect to the pressing head 252. Thus, the flexible printed circuit board side pressed surface 32 is positioned with respect to the pressing head 252. Operations of the flexible printed circuit board pressing process is started with keeping a heated state of the glass substrate GS heated in the driver pressing process.

As illustrated in FIG. 13, in the flexible printed circuit board pressing process, the pressing head 252 is lowered in the Z-axis direction (to be closer to the glass substrate GS) with the substrate support portion 51 supporting the flexible printed circuit board mounting portion 26 of the glass substrate GS from the other surface 22 side, and the pressing head 252 comes in contact with a portion of the buffer 57 overlapping the flexible printed circuit board 30 (the flexible printed circuit board side pressed surface 32). From this state, the pressing head 252 is further lowered in the Z-axis direction to the height of the opposing surface 252*a* of the pressing head 252 in the driver pressing process and applies pressure force to the flexible printed circuit board side pressed surface 32 with elastically deforming the contact portion of the buffer 57. The opposing surface 252*a* of the pressing head 252 functions as a flexible printed circuit board pressing surface 254. The thermal pressing of the flexible printed circuit board 30 is completed with the similar operations of the flexible printed circuit board pressing process of the first embodiment and the pressing head 252 is lifted again. In the present embodiment, the driver pressing process and the flexible printed circuit board pressing process are performed by repeating lowering and lifting of the pressing head 252 twice without having time lag that may allow cooling of the driver mounting portion 27 to a normal temperature.

A common technology in the present embodiment and the first embodiment is that the driver 40 and the flexible printed circuit board 30 are thermally pressed with one pressing head and the mounting errors of the driver 40 and the flexible printed circuit board 30 are less likely to be caused. In the first embodiment, the pressing head 52 is spatially defined into the driver pressing surface 53 and the flexible printed circuit board pressing surface 54 to commonly use one pressing head for the driver 40 and the flexible printed circuit board 30. In the present embodiment, the pressing head 252 is used at a different timing for the driver 40 and the flexible printed circuit board 30 to be used as the driver pressing surface 253 and the flexible printed circuit board pressing surface 254.

According to the method of manufacturing the liquid crystal panel 11 (the array substrate 11*b*) of the present embodiment, the pressing is executed with one pressing head 252 such that the driver pressing surface 253 and the flexible printed circuit board pressing surface 254 are at a same height with respect to the mounting surface 21 of the glass substrate GS in the driver pressing process and the flexible printed circuit board pressing process. Even if the driver 40 and the flexible printed circuit board 30 may be arranged very close to each other (for example, 0.25 mm≤G≤0.6 mm) due to reduction in frame size of the liquid crystal display device 10 and the flexible printed circuit board pressing surface 54 may be in contact with the driver 40 or the driver pressing surface 53 may be in contact with the flexible printed circuit board 30, a predetermined pressure force can be applied to the driver 40 and the flexible printed circuit board 30. Therefore, the driver 40 and the flexible printed circuit board 30 can be surely mounted on the glass substrate GS.

According to the present embodiment, a portion where mounting is executed and the mounting portion of the substrate where the mounting is executed in one of the driver mounting process and the flexible printed circuit board mounting process are not heated again in another one of the processes after being cooled down, even if the driver 40 and the flexible printed circuit board 30 are arranged to be close to each other due to the reduction of frame size of the liquid crystal display device 10. Therefore, a bonding strength of the mounted portion is less likely to be lowered or unintentional reaction force is less likely to be generated due to deformation of the panel by re-heating of the mounted portion and the mounting portion of the substrate.

<Other Embodiments>

The present invention is not limited to the embodiments, which have been described using the foregoing descriptions and the drawings. For example, embodiments described below are also included in the technical scope of the present invention.

(1) In each of the above embodiments, the device includes one driver as an electronic component and one flexible printed circuit board. However, the number of the driver and the number of the flexible printed circuit board may be altered according to a size or resolution of the liquid crystal panel or the number of mounted terminals.

(2) In each of the above embodiments, the driver is at a height level from the array substrate higher than the flexible printed circuit board. However, it is not limited thereto. The flexible printed circuit board and the driver are on a same height level or the flexible printed circuit board may be at a height level larger than the driver.

(3) In each of the above embodiments, the flexible printed circuit board is longer than the driver in the Y-axis direction (the longitudinal direction of the driver, a direction along an edge portion of the flexible printed circuit board) and they are arranged such that middle portions thereof are correspond to each other. However, it is not limited thereto. The size and the arrangement of the flexible printed circuit board and the driver may be designed according to a size or resolution of the liquid crystal panel or the number of mounted terminals.

(4) In the third embodiment, the driver mounting process and the flexible printed circuit board mounting process are performed successively in this order. However, the processes may be performed in the reversed order and operations and effects similar to those in the third embodiment are obtained.

(5) In each of the above embodiments, the substrate support portion is fixed in the device. However, it is not limited thereto. For example, the substrate support portion may be movable in the Z-axis direction similarly to the pressing head. The support base may extend to the driver mounting portion of the glass substrate such that the substrate support portion and the support base are provided integrally with each other and the substrate support portion may be moved in conjunction with the support base.

(6) Each of the above embodiments describes a manufacturing apparatus for mounting the driver and the flexible printed circuit board on the array substrate included in a transmissive liquid crystal display device including a backlight device as an external light source and a manufacturing method with using the apparatus. The present invention may be applied to a manufacturing apparatus for mounting the driver and the flexible printed circuit board on the array substrate included in a reflective liquid crystal display device using external light and a manufacturing method with using the apparatus.

(7) In each of the embodiments, the TFTs are used as switching components of the liquid crystal display device. However, a manufacturing apparatus for mounting the driver and the flexible printed circuit board on the array substrate included in liquid crystal display devices that include switching components other than TFTs (e.g., thin film diodes (TFDs)) and a manufacturing method with using the apparatus may be included in the scope of the present invention. Furthermore, a manufacturing apparatus for mounting the driver and the flexible printed circuit board on the array substrate included in black-and-white liquid crystal display devices, other than color liquid crystal display device, and a manufacturing method with using the apparatus are also included in the scope of the present invention.

(8) The manufacturing apparatus for mounting the driver and the flexible printed circuit board on the array substrate included in liquid crystal display devices including the liquid crystal panels as the display panels and a manufacturing method with using the apparatus are described as the embodiments. However, a manufacturing apparatus for mounting the driver and the flexible printed circuit board on the bonded substrate included in display devices that include other types of display panels (e.g., plasma display panels (PDPs) and organic EL panels) and a manufacturing method with using the apparatus are also included in the scope of the present invention.

EXPLANATION OF SYMBOLS

11: liquid crystal panel, 11b: array substrate (mounting substrate), 21: mounting surface (one plate surface), 22: another plate surface, 23: panel-side flexible printed circuit board terminal (flexible printed circuit board terminal), 24a, 24b: panel-side driver terminal (electronic component terminal), 26: flexible printed circuit board mounting portion, 27: driver mounting portion, 28: anisotropic conductive film, 30: flexible printed circuit board, 31: edge portion, 40: driver (electronic component), 50, 150, 250: driver and flexible printed circuit board mounting apparatus (mounting apparatus), 51: substrate support portion, 52, 252: pressing head, 53, 253: driver pressing surface (electronic component pressing surface), 54, 254: flexible printed circuit board pressing surface (flexible printed circuit board pressing surface), 55: lifting/lowering device (moving means), 57: buffer, 58: substrate support portion-side buffer, SE: edge portion

The invention claimed is:

1. A method of manufacturing a mounting substrate comprising:
    a provisional pressing process in which an electronic component and a flexible printed circuit board are provisionally pressed on a substrate, the flexible printed circuit board for transferring signals from outside and the electronic component for processing the signals from the flexible printed circuit board being mounted on one plate surface of the substrate;
    an electronic component pressing process in which a provisionally pressed electronic component is thermally pressed with using a pressing head having an electronic component pressing surface for pressing the electronic component and a flexible printed circuit board pressing surface for pressing the flexible printed circuit board, and the pressing head is moved closer to the substrate with having a buffer between the electronic component pressing surface and the electronic component and presses the electronic component with elastically deforming the buffer;
    a flexible printed circuit board pressing process in which a provisionally pressed flexible printed circuit board is thermally pressed to the substrate with using the pressing head, and the pressing head is moved closer to the substrate having the buffer between the flexible printed circuit board pressing surface and the flexible printed circuit board such that a height level of the flexible printed circuit board pressing surface with respect to the one plate surface of the substrate is same as a height level of the electronic component pressing surface with respect to the one plate surface of the substrate in the electronic component pressing process, and the pressing head presses the flexible printed circuit board with elastically deforming the buffer; and
    a positioning process;
    wherein the electronic component pressing process and the flexible printed circuit board pressing process are performed simultaneously, the pressing head has a flat opposing surface opposing the one plate surface of the substrate, and the opposing surface includes the electronic component pressing surface and the flexible printed circuit board pressing surface to be arrange;
    wherein the positioning process in which the provisionally pressed electronic component and the provisionally pressed flexible printed circuit board are positioned with respect to the pressing head, the electronic component is on an inner side with respect to the flexible printed circuit board on the one plate surface of the substrate, and a position of an inner side edge portion of the electronic component is detected and the position of the inner side edge portion of the electronic component is positioned with respect to the pressing head.

2. The method of manufacturing a mounting substrate according to claim 1, wherein
    the electronic component pressing process and the flexible printed circuit board pressing process are successively performed in this sequence or in a reverse sequence,
    one of the electronic component pressing process and the flexible printed circuit board pressing process that is performed first is a previous process and another one of the electronic component pressing process and the flexible printed circuit board pressing process that is performed later is a latter process, and
    a performance of the latter process is started with keeping a heated state of the substrate that is heated in the previous process.

3. The method of manufacturing a mounting substrate according to claim 1, further comprising:
- a terminal cleaning process in which an electronic component mounting portion and a flexible printed circuit board mounting portion of the substrate are collectively cleaned, the electronic component mounting portion including electronic component terminals where the electronic component is to be mounted and the flexible printed circuit board mounting portion including flexible printed circuit board terminals where the flexible printed circuit board is to be mounted; and
- an anisotropic conductive film applying process in which an anisotropic conductive film is applied on each of a cleaned electronic component mounting portion and a cleaned flexible printed circuit board before the provisional pressing process.

4. A mounting substrate manufacturing apparatus comprising:
- a substrate support portion supporting a substrate that has one plate surface and another plate surface, a flexible printed circuit board for transmitting signals from outside and an electronic component for processing the signals from the flexible printed circuit board are to be mounted on the one plate surface of the substrate, the substrate support portion supporting the substrate from another plate surface side;
- a pressing head arranged on a side of the one plate surface of the substrate, the pressing head having an electronic component pressing surface provisionally pressing the electronic component with respect to the substrate support portion and a flexible printed circuit board pressing surface provisionally pressing the flexible printed circuit board with respect to the substrate support portion, and the pressing head having a flat opposing surface opposing the one plate surface of the substrate and the opposing surface including the electronic component pressing surface and the flexible printed circuit board pressing surface;
- moving means moving the pressing head to be closer to the substrate, the moving means moving the pressing head such that the electronic component pressing surface and the flexible printed circuit board pressing surface are at a same height level with respect to the one plate surface of the substrate, and the moving means applying pressure force to the electronic component and the flexible printed circuit board with elastically deforming a buffer that is between the electronic component pressing surface and the electronic component and between the flexible printed circuit board pressing surface and the flexible printed circuit board; and
- wherein the provisionally pressed electronic component and the provisionally pressed flexible printed circuit board are positioned with respect to the pressing head, the electronic component is on an inner side with respect to the flexible printed circuit board on the one plate surface of the substrate, and a position of an inner side edge portion of the electronic component is detected and the position of the inner side edge portion of the electronic component is positioned with respect to the pressing head.

5. The mounting substrate manufacturing apparatus according to claim 4, wherein the substrate support portion supports the substrate having a substrate support portion-side buffer between the substrate and the substrate support portion.

6. A method of manufacturing a mounting substrate comprising:
- a provisional pressing process in which an electronic component and a flexible printed circuit board are provisionally pressed on a substrate, the flexible printed circuit board for transferring signals from outside and the electronic component for processing the signals from the flexible printed circuit board being mounted on one plate surface of the substrate;
- an electronic component pressing process in which a provisionally pressed electronic component is thermally pressed with using a pressing head having an electronic component pressing surface for pressing the electronic component and a flexible printed circuit board pressing surface for pressing the flexible printed circuit board, and the pressing head is moved closer to the substrate with having a buffer between the electronic component pressing surface and the electronic component and presses the electronic component with elastically deforming the buffer; and
- a flexible printed circuit board pressing process in which a provisionally pressed flexible printed circuit board is thermally pressed to the substrate with using the pressing head, and the pressing head is moved closer to the substrate having the buffer between the flexible printed circuit board pressing surface and the flexible printed circuit board such that a height level of the flexible printed circuit board pressing surface with respect to the one plate surface of the substrate is same as a height level of the electronic component pressing surface with respect to the one plate surface of the substrate in the electronic component pressing process, and the pressing head presses the flexible printed circuit board with elastically deforming the buffer;
- wherein the electronic component pressing process and the flexible printed circuit board pressing process are successively performed in this sequence or in a reverse sequence,
- one of the electronic component pressing process and the flexible printed circuit board pressing process that is performed first is a previous process and another one of the electronic component pressing process and the flexible printed circuit board pressing process that is performed later is a latter process, and
- a performance of the latter process is started with keeping a heated state of the substrate that is heated in the previous process.

7. The method of manufacturing a mounting substrate according to claim 6, further comprising:
- a terminal cleaning process in which an electronic component mounting portion and a flexible printed circuit board mounting portion of the substrate are collectively cleaned, the electronic component mounting portion including electronic component terminals where the electronic component is to be mounted and the flexible printed circuit board mounting portion including flexible printed circuit board terminals where the flexible printed circuit board is to be mounted; and
- an anisotropic conductive film applying process in which an anisotropic conductive film is applied on each of a cleaned electronic component mounting portion and a cleaned flexible printed circuit board before the provisional pressing process.

* * * * *